(12) United States Patent
Cohen et al.

(10) Patent No.: US 6,225,013 B1
(45) Date of Patent: May 1, 2001

(54) STITCHING DESIGN RULES FOR FORMING INTERCONNECT LAYERS

(75) Inventors: David Cohen, Nesher; Ephie Koltin, Givat Ela; Margalit Ilovich Ayelet, Nesher; Amit Shacham, Haifa, all of (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/315,895

(22) Filed: May 20, 1999

(51) Int. Cl.[7] ........................................ G03F 9/00
(52) U.S. Cl. ................... 430/30; 430/5; 430/22
(58) Field of Search .................. 430/5, 30, 22

(56) References Cited

U.S. PATENT DOCUMENTS

| | | | |
|---|---|---|---|
| 5,663,017 | * 9/1997 | Schinella et al. | 430/5 |
| 5,922,495 | * 7/1999 | Kim | 430/5 |
| 6,030,752 | * 2/2000 | Fulford, Jr. et al. | 430/312 |
| 6,040,095 | * 3/2000 | Enichen et al. | 430/5 |
| 6,051,344 | * 4/2000 | Langston et al. | 430/5 |

* cited by examiner

Primary Examiner—Christopher G. Young
(74) Attorney, Agent, or Firm—Bever, Hoffman & Harms, LLP; E. Eric Hoffman

(57) ABSTRACT

A method for stitching a plurality of mask regions including the steps of (1) defining cut regions on the mask regions, wherein the cut regions adjoin the edges of the mask regions to be stitched, (2) implementing a first set of design rules in the cut regions, and (3) implementing a second set of design rules outside of the cut regions. The mask regions can be formed on a single reticle or on a plurality of separate reticles. In one embodiment, the first set of design rules specifies that trace patterns in the cut regions have widths greater than trace patterns outside of the cut regions. In another embodiment, the first set of design rules specifies that trace patterns in the cut regions have a minimum spacing greater than trace patterns outside of the cut regions. In yet another embodiment, the first set of design rules specifies that trace patterns can be formed entirely within the cut regions. The stitching method can also include the steps of (1) defining a cut line on a wafer, (2) aligning first and second mask regions with the cut line such that transparent regions of the first and second mask regions have a controlled amount of overlap with respect to the cut line, and (3) selecting the controlled amount of overlap such that a pattern formed by the first and second mask regions has a uniform width adjacent to the cut line.

23 Claims, 23 Drawing Sheets

STITCHING DESIGN RULES FOR FORMING INTERCONNECT LAYERS

FIELD OF THE INVENTION

The present invention relates to methods of forming photoresist masks for a semiconductor process. More specifically, the present invention relates to methods for forming photoresist masks using stitching techniques.

BACKGROUND OF THE INVENTION

During semiconductor processing, an interconnect layer is typically formed as follows. A conductive layer (e.g., polysilicon, metal 1, metal 2, etc.) is blanket deposited over an upper surface of a wafer. A layer of photosensitive material (i.e., photoresist) is then deposited over the upper surface of the conductive layer. The photoresist is exposed to illumination through a reticle. The reticle includes a pattern of opaque and transparent areas that define a desired pattern of the conductive layer. The exposed portions of the photoresist layer undergo a chemical change which enables these exposed portions to be removed by a developing solution, while the unexposed portions of the photoresist layer are largely unaffected by the developing solution. After the developing step is completed, a pattern of photoresist remains over the conductive layer. The photoresist pattern defines the desired pattern of the conductive layer. An etch is then performed to remove the exposed portions of the conductive layer, thereby patterning the conductive layer. The photoresist pattern is then removed.

A typical wafer has a diameter of about 150 mm. Conventional wafers can also have other diameters, such as 200 mm or 300 mm. A conventional reticle can have a maximum field of exposure of 20 mm by 20 mm with a minimum feature size of 0.5 microns (or less) on the wafer. Other conventional reticles can have other maximum fields of exposure, such as 22×22 mm or 33×25 mm. The field of exposure is defined as the photoresist area exposed through the reticle at one time. Thus, to expose the entire photoresist layer, the reticle is sequentially exposed, moved (i.e., stepped) to an adjacent area, and then exposed again. A stepper device is provided to move the reticle between exposures. Because each die fabricated on the wafer typically has an area of less than 20 mm by 20 mm, the reticle includes the pattern(s) for an integer number of dice.

FIG. 1 is a top view of a wafer 100 that includes a plurality of dice 101–123. In this case, reticle 125 is exposed one time for each of dice 101–123. Thus, reticle 125 is exposed and stepped twenty three times to complete the patterning of dice 101–123. The pattern on reticle 125 is typically 4 to 5 times larger than the desired dimension on the wafer, depending on the type of stepper device. The stepper device optically shrinks the pattern on the reticle, thereby providing an exposed pattern on the wafer that has the desired dimension. The ratio of reduction is fixed for a specific stepper, and cannot be changed.

A mask aligner is a different exposure tool, which exposes a mask having dimensions equal to the dimensions of the wafer. The mask aligner does not shrink the pattern of the mask. Thus, the dimensions of the pattern of the mask are identical to the dimensions of the exposed pattern on the wafer. The mask aligner is capable of simultaneously exposing a pattern over the entire upper surface of a wafer. However, a mask aligner undesirably results in a larger minimum feature size, typically on the order of about 1.2 microns or greater.

It would be desirable to create an interconnect structure having an area greater than 20 mm×20 mm with a minimum feature size of 0.5 microns (or less). One product that would benefit from such an interconnect structure is an image sensor for a digital still camera. Digital still cameras require an ultra-high resolution image sensor to produce pictures with a quality similar to, or higher than, that achieved by conventional 35 mm film-based cameras. To achieve high resolution, image sensors require a large number of pixels on a single chip. Placing a large number of pixels on a single chip requires a relatively large chip. (Note that it is not practical to reduce the pixel size beyond a certain point, as this would require focusing light using high quality lenses. Such lenses cost an order of magnitude more than standard lenses used today, leading to higher system cost.) The size of the chip, however, is limited by the field of exposure of the photolithography equipment used to pattern the interconnect structures of the chip. As described above, modern stepping photolithography equipment has a fixed, relatively small field of exposure. The desirable die size of an image sensor far exceeds the limited field of exposure of conventional photolithography equipment. An improved solution is therefore required to enable the exposure of a die having an area greater than the field of exposure of the photolithography equipment.

It would therefore be desirable to have a method for patterning an interconnect layer having a relatively small minimum feature size (i.e., 0.5 microns or less), wherein the interconnect layer is patterned over an area that is larger than the standard field of exposure of a reticle.

SUMMARY OF THE INVENTION

Accordingly, the present invention provides improved methods for stitching a plurality of mask regions to form a large interconnect structure. Each of the mask regions has a relatively small minimum feature size (e.g., 0.5 microns or smaller). Stitching the mask regions together advantageously enables the fabrication of a relatively large interconnect structure having a relatively small minimum feature size. In one embodiment, the mask regions to be stitched are formed on a single reticle. Alternatively, the mask regions to be stitched can be formed on a plurality of separate reticles.

One improved stitching process includes the steps of (1) defining cut regions on the mask regions, wherein the cut regions are located immediately adjacent to the edges of the mask regions to be stitched, (2) implementing a first set of design rules in the cut regions, and (3) implementing a second set of design rules outside of the cut regions. The first set of design rules is selected to ensure that the stitching process results in the formation of acceptable interconnect traces in the cut regions. The first set of design rules is advantageously limited to relatively small areas of the mask regions (i.e., the cut regions). The second set of design rules is a conventional set of design rules used when forming a reticle. The second set of design rules is used for a large area of the mask regions (i.e., outside the cut regions).

In one embodiment, the first set of design rules specifies that trace patterns of the mask region are wider in the cut regions than outside of the cut regions. This ensures that the resulting interconnect traces have an adequate width in the cut regions.

In another embodiment, the first set of design rules specifies that trace patterns of the mask region are spaced further apart in the cut regions than outside of the cut regions. This ensures that the resulting interconnect traces have adequate line-to-line spacing in the cut regions.

In another embodiment, the first set of design rules specifies that trace patterns of the mask region must cross the cut region in a perpendicular manner. This advantageously simplifies the stitching process.

In yet another embodiment, the first set of design rules specifies that an interconnect can be formed entirely within the cut region (i.e., in parallel with the cut region. This advantageously increases the different types of interconnect traces that can be fabricated in accordance with the present invention.

The present invention also includes a stitching method that includes the steps of (1) defining a cut line on a first mask region and a second mask region, wherein the first mask region and the second mask region are stitched together on a wafer along the cut line, (2) aligning the cut lines of the first and second mask regions such that transparent regions of the first and second mask regions have a controlled amount of overlap with respect to the cut line, and (3) selecting the controlled amount of overlap such that the trace patterns formed by the first and second mask regions have a uniform width adjacent to the cut line.

The present invention also includes methods for testing the accuracy of a stitching process. In one embodiment of the present invention, a testing method includes the steps of (1) aligning and exposing a first mask region having a first half of a box-in-box pattern, (2) aligning and exposing a second mask region having a second half of the box-in-box pattern, wherein the first and second halves of the box-in-box pattern, when properly aligned, combine to form a complete box-in-box pattern, and (3) monitoring the exposed box-in-box pattern to determine the accuracy of the stitching process. In a particular embodiment the monitoring step is performed with a microscope.

Another testing method uses a reticle having three mask regions. This testing method includes the steps of (1) exposing a first mask region that defines a first half of an interconnect pattern, (2) exposing a second mask region that defines a second half of the interconnect pattern, wherein if the first mask region is properly aligned with the second mask region, a complete interconnect pattern is defined, (3) exposing a third mask region that defines the complete interconnect pattern, and (4) comparing the interconnect pattern defined by the first and second mask regions with the complete interconnect pattern defined by the third mask region to determine the accuracy of the stitching process. In one embodiment, the step of comparing is performed by comparing the electrical characteristics of the interconnect pattern formed by the first and second mask regions with the electrical characteristics of the interconnect pattern formed by the third mask region.

Another testing method includes the steps of (1) exposing a dark field resolution mask over a photoresist layer, wherein the dark field resolution mask defines a plurality of parallel lines having a first length that extend along a first axis, (2) stepping the dark field resolution mask along the first axis by a distance that is less than the first length along the first axis, (3) exposing the dark field resolution mask over the photoresist layer a second time, (4) developing the photoresist layer, thereby creating a photoresist pattern, and (5) monitoring the photoresist pattern to determine the accuracy of the stitching process. In one embodiment, the monitoring step is performed using a microscope.

The present invention will be more fully understood in light of the following detailed description taken together with the drawings.

DETAILED DESCRIPTION

In accordance with one embodiment of the present invention, an improved mask stitching process is used to pattern an interconnect layer for a die having dimensions greater than the standard field of exposure of a reticle. In general, mask stitching refers to a process wherein a photoresist layer is exposed and re-exposed through portions of a single reticle or multiple reticles, with the various exposures being aligned (or stitched) to form the desired pattern.

Figure 1:
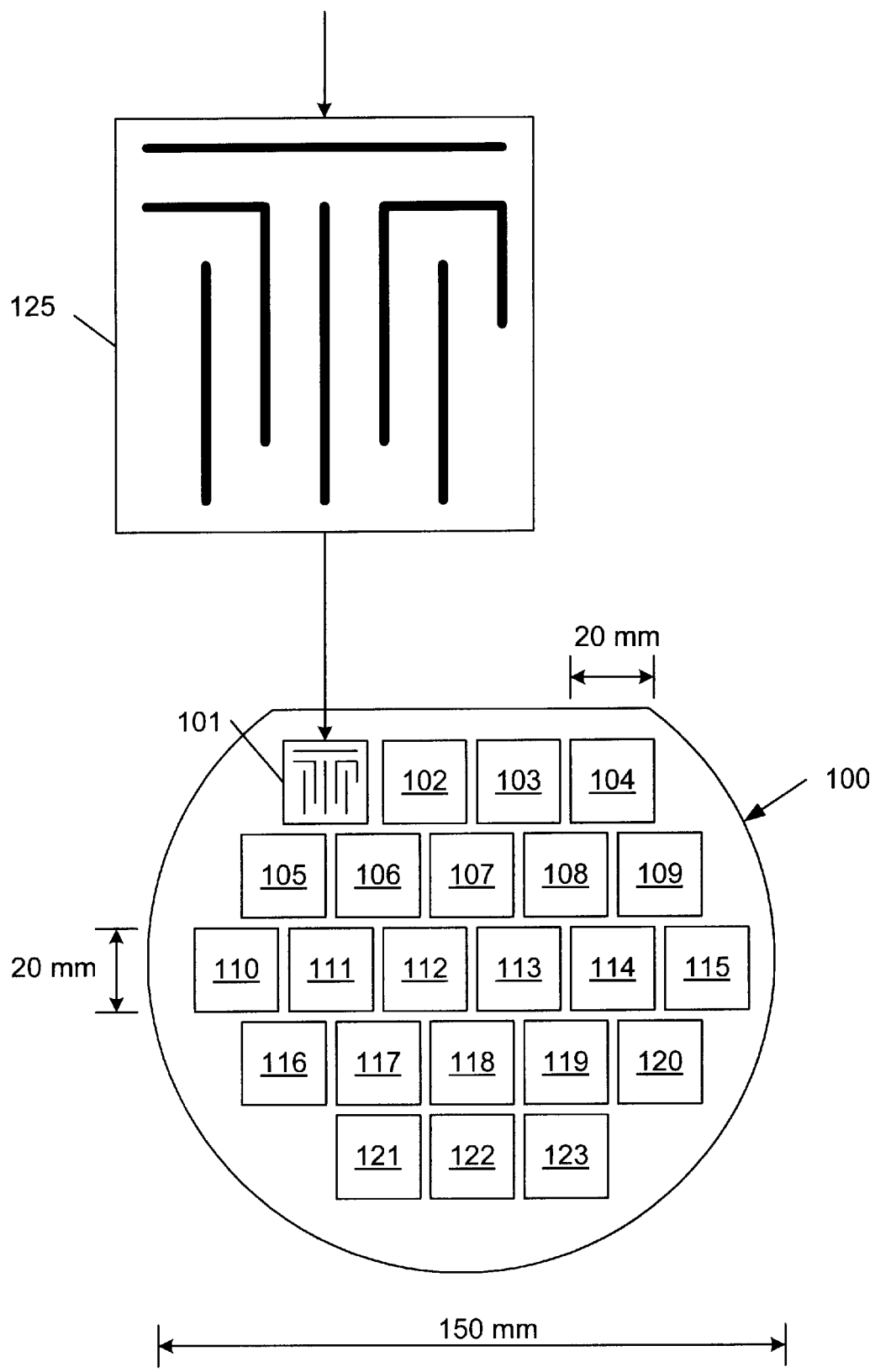
FIG. 1 is a top view of a conventional wafer being patterned from a reticle.
Figure 2:
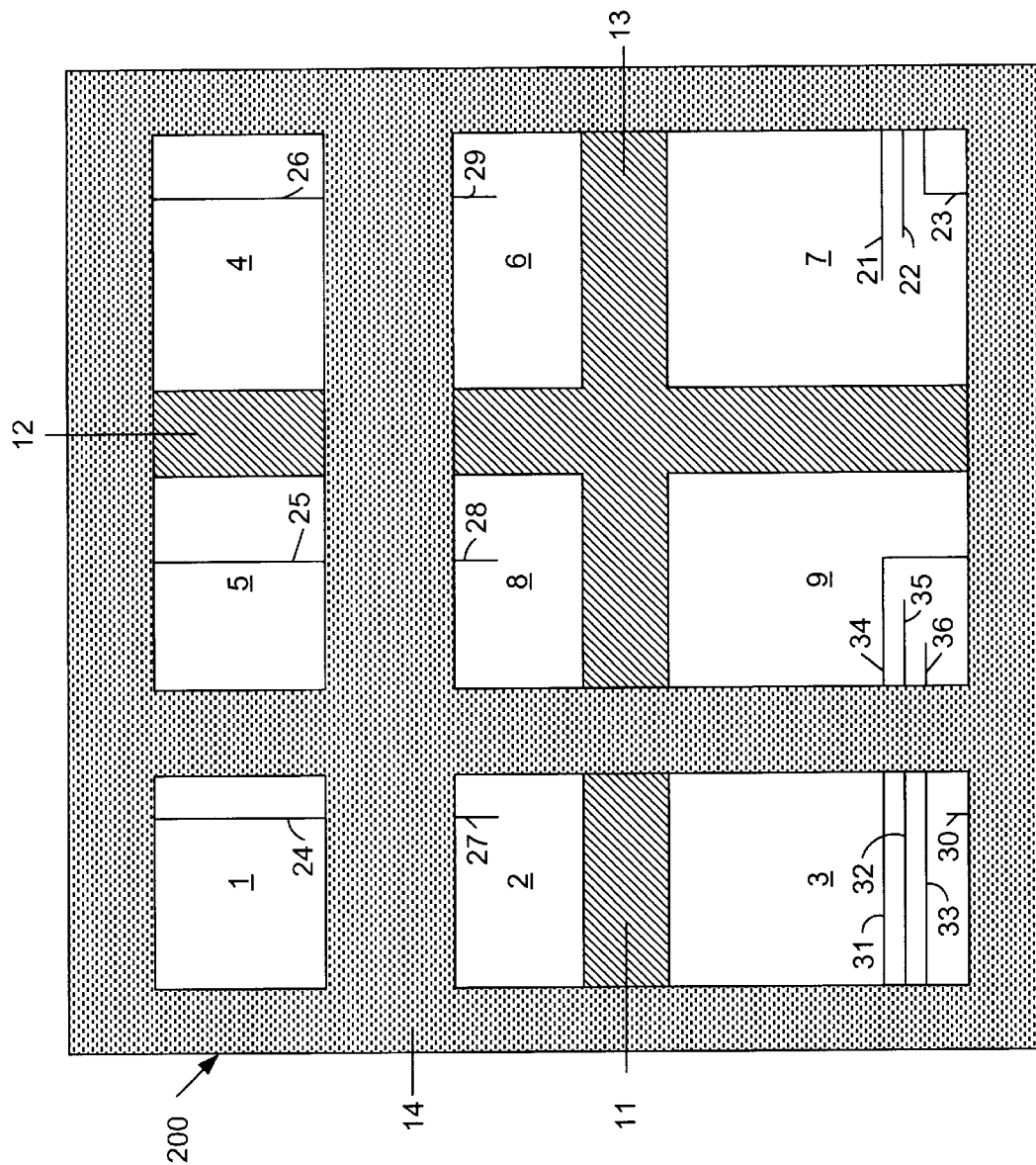
FIG. 2 is a top view of a reticle that is used in a mask stitching process in accordance with one embodiment of the present invention.

FIG. 2 is a top view of a reticle 200 that is used in a mask stitching process in accordance with one embodiment of the present invention. Reticle 200 has a field of exposure of 20 mm by 20 mm with a minimum feature size of 0.5 microns. In other embodiments, reticle 200 can have other sizes (e.g., 22×22 mm or 33×25 mm) and other minimum feature sizes (e.g., 0.18 microns or smaller). Reticle 200 is sub-divided into nine mask regions 1–9. Mask regions 1–9 include trace patterns 21–36 as illustrated. Reticle 200 further includes scribe line patterns 11–13 and blinding region 14. In the described example, trace patterns 21–36, scribe line patterns 11–13 and blinding region 14 are opaque. At any given time, reticle 200 is exposed through a subset of the nine mask regions 1–9, wherein each subset is surrounded by blinding region 14. For example, reticle 200 can be exposed through mask region 1 (first subset), mask regions 2–3 (second subset), mask regions 4–5 (third subset) or mask regions 6–9 (fourth subset). Note that each of these subsets of mask regions is entirely surrounded by blinding region 14. The stepper machine that exposes reticle 200 is able to expose only one of these four subsets at a given time by using a conventional blading system. The blading system includes a series of blades that are positioned over reticle 200, thereby covering all but one of the subsets of the nine mask regions 1–9. In other embodiments, other reticle configurations, having other numbers of mask regions, can be used.

Figure 3:
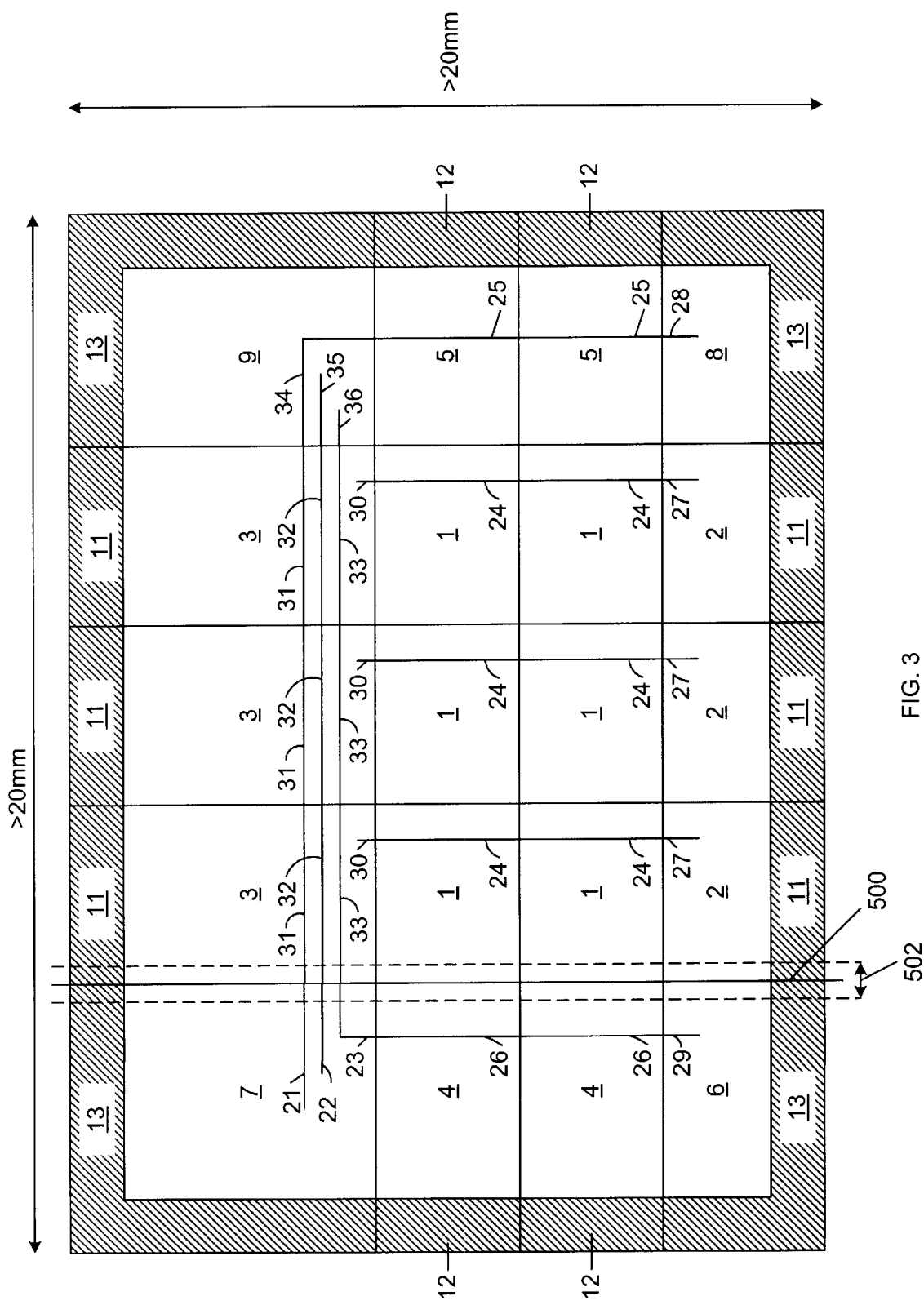
FIG. 3 is a top view of a photoresist layer that is patterned using reticle of FIG. 2.

FIG. 3 is a top view of a photoresist layer that is patterned using reticle 200. In the described embodiment, the stepper exposes mask region 7, thereby transferring trace patterns 21–23 and scribe line 13 to the photoresist layer. Note that mask regions 6, 8 and 9 (not shown) are also exposed at this time. The stepper subsequently moves reticle 200 and exposes mask region 3 at a location adjacent to where mask region 7 was exposed. Mask region 2 (not shown) is also exposed at this time. As a result, trace patterns 30–32 and scribe line 11 are transferred to the photoresist layer. Note that trace patterns 21–23 of mask region 7 are aligned with trace patterns 31–33, respectively, of mask region 3. This alignment is referred to as stitching because the images formed by mask regions 7 and 3 are "stitched" together to form a continuous image. Mask regions 7 and 3 are aligned along cut line 500 as illustrated in FIG. 3. Cut line 500 is an imaginary line defined on both mask regions 7 and 3. A cut region 502 is defined on either side of cut line 500. Cut line 500 and cut region 502 are described in more detail below.

The above-described step and expose process is repeated until all of the mask regions 1–9 are exposed in the pattern illustrated in FIG. 3. To form the pattern of FIG. 3, mask regions 7, 9, 6 and 8 are each exposed once, mask regions 4 and 5 are each exposed twice, mask regions 2 and 3 are each exposed three times, and mask region 1 is exposed six times. These various mask regions can be exposed multiple times because the trace patterns included in these mask regions are repeated in the interconnect pattern. By exposing the mask regions multiple times, the resulting area of the interconnect pattern can be greater than 20 mm by 20 mm, while the minimum feature size remains equal to 0.5 microns (or less). Note that if the interconnect pattern is repeatable, the size of the interconnect pattern is limited only by the size of the wafer.

The present invention provides improved processes for implementing stitching, thereby assuring that the resulting interconnect structure exhibits the desired mechanical and electrical characteristics.

In one embodiment of the invention, the stitching process is improved by defining cut lines and adjacent cut regions at the locations on the reticle where the mask regions are to be stitched. In the described embodiments, the cut regions are defined as extending a fixed distance on either side of the cut line. A separate set of design rules is used in the cut regions to ensure that the resulting interconnect structures are properly formed in the cut regions. In the described embodiments, each cut region is centered around a cut line, and is defined to have a width of 1 micron. Thus, cut region 502 extends 0.5 microns on either side of cut line 500. However, cut regions having other widths are possible and considered to be within the scope of the present invention. Design rules within the cut regions are defined as follows in accordance with various embodiments of the invention. In accordance with one design rule, the amount of overlap of the mask regions adjacent to the cut line is controlled to prevent the formation of notched interconnect lines, interconnect lines with scum and interconnect lines with bridging.

In accordance with another design rule, the trace patterns of the mask regions are widened slightly in the cut regions to compensate for cases where the amount of mask region overlap at locations adjacent to the cut line is less than expected. If the amount of mask region overlap is less than expected, notched (i.e., narrowed) interconnect lines will result. The wider trace patterns in the cut regions compensate for these notched lines, thereby ensuring a minimum line width in the cut region.

In accordance with another design rule, the spacing between the trace patterns is widened slightly in the cut region to compensate for cases where the amount of mask region overlap at locations adjacent to the cut line is greater than expected. If the amount of mask region overlap is greater than expected, interconnect lines having scum (i.e., widening) will result. The wider spacing between the trace patterns in the cut regions compensates for these scum lines, thereby ensuring a minimum spacing between interconnect lines in the cut region.

In accordance with yet another design rule, interconnect lines that cross a cut region must cross the cut region perpendicularly. In accordance with another design rule, it is possible to form an interconnect line within the cut region in parallel with the cut line. These various design rules are described in more detail below.

Figure 4:
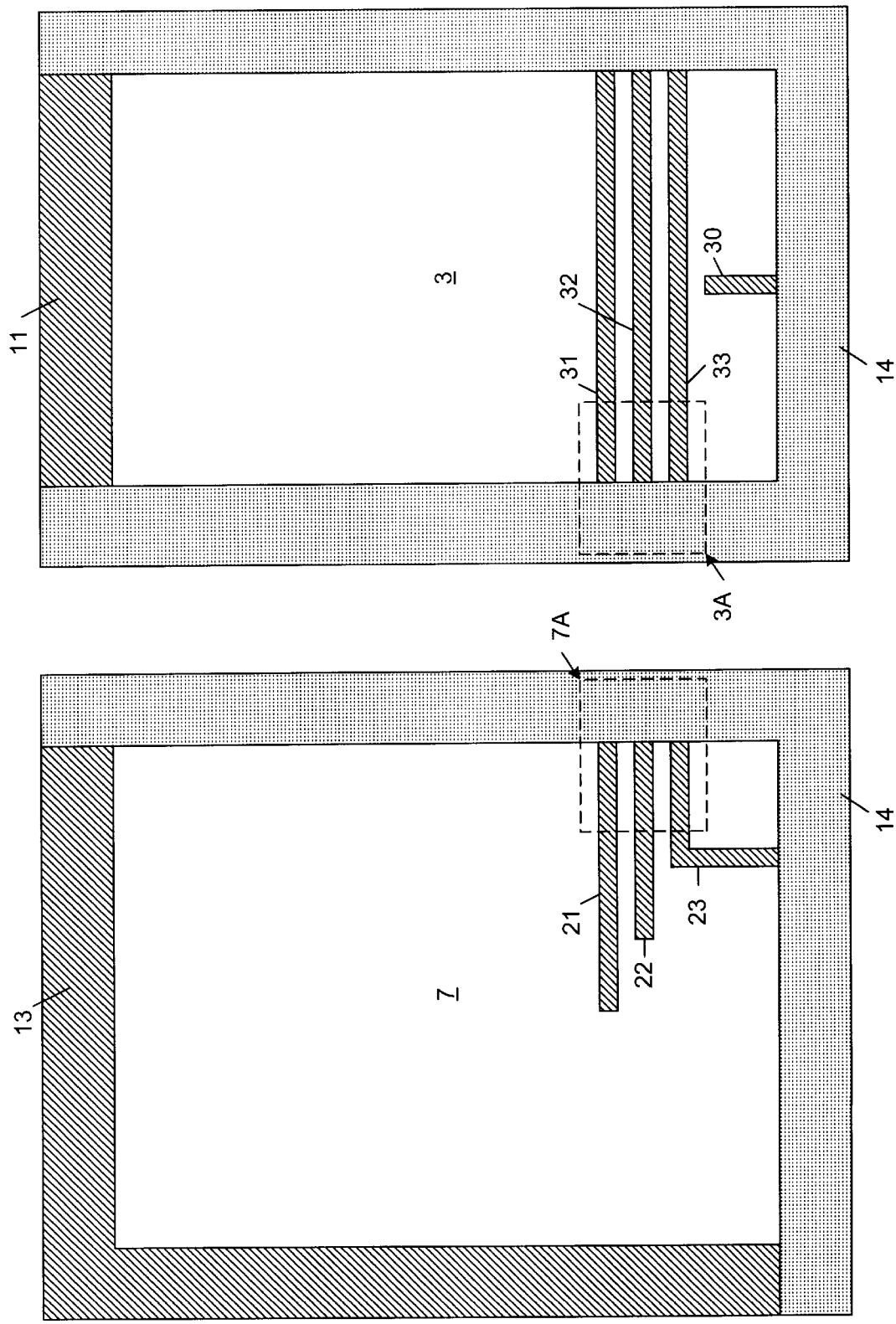
FIG. 4 is a schematic diagram illustrating two of the mask regions of the reticle of FIG. 2 that are exposed through the blading system of a stepper in accordance with one embodiment of the present invention.

FIG. 4 is a schematic diagram illustrating the portions of mask regions 3 and 7 that are exposed through the blading system of a stepper in accordance with one embodiment of the present invention. The described embodiments use a NIKON NSR2005iD11 stepper, which is available from Nikon, Inc. This Nikon stepper has an alignment accuracy of 0.1 microns. Note that when exposing mask region 7, portions blinding region 14 are exposed by the blading system. Similarly, when exposing mask region 3, portions blinding region 14 are exposed by the blading system. The design rules of the present invention are described in connection with the stitching of trace patterns 21–23 of mask region 7 with corresponding trace patterns 31–33 of mask region 3. Because the main areas of interest in the stitching of trace patterns 21–23 and 31–33 exist immediately adjacent to blinding region 14, the various embodiments are described in connection with mask sub-region 7A of mask region 7 and mask sub-region 3A of mask region 3. As illustrated in FIG. 4, mask sub-region 7A includes portions of trace patterns 21–23 and blinding region 14. Similarly, mask sub-region 3A includes portions of trace patterns 31–33 and blinding region 14.

Figure 5:
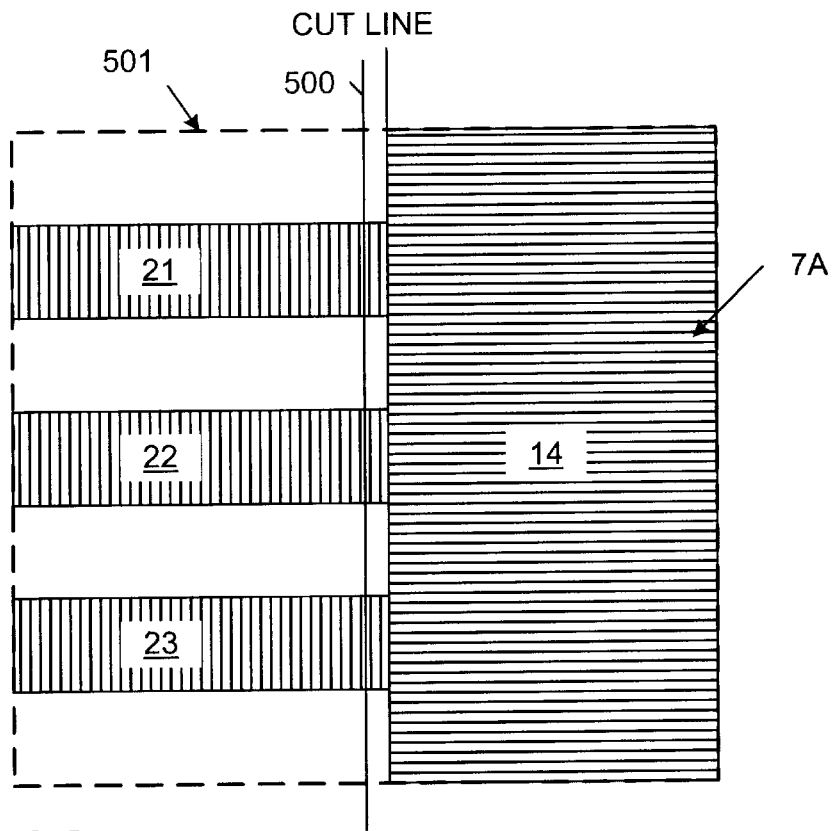
FIG. 5 is a top view of a photoresist layer that is exposed through a first mask sub-region.

FIG. 5 is a top view of a region of a photoresist layer 501 that is patterned through mask sub-region 7A. Mask region 7 is aligned on the photoresist layer, such that mask sub-region 7A is aligned over photoresist region 501 as illustrated. Cut line 500 is an imaginary line on mask region 7 that defines the location where mask region 7 is to be stitched to mask region 3. Cut region 502 is not illustrated in FIG. 5 (or FIGS. 6–9) for purposes of clarity. In the described embodiment, cut line 500 is located on mask sub-region 7A such that cut line 500 is not precisely aligned with blinding region 14. Instead, blinding region 14 is located slightly to the right of cut line 500. As a result, the transparent portion of mask sub-region 7A has a slight overlap with respect to cut line 500. As described in more detail below, this slight overlap is controlled to control the formation of the resulting traces.

Figure 6:
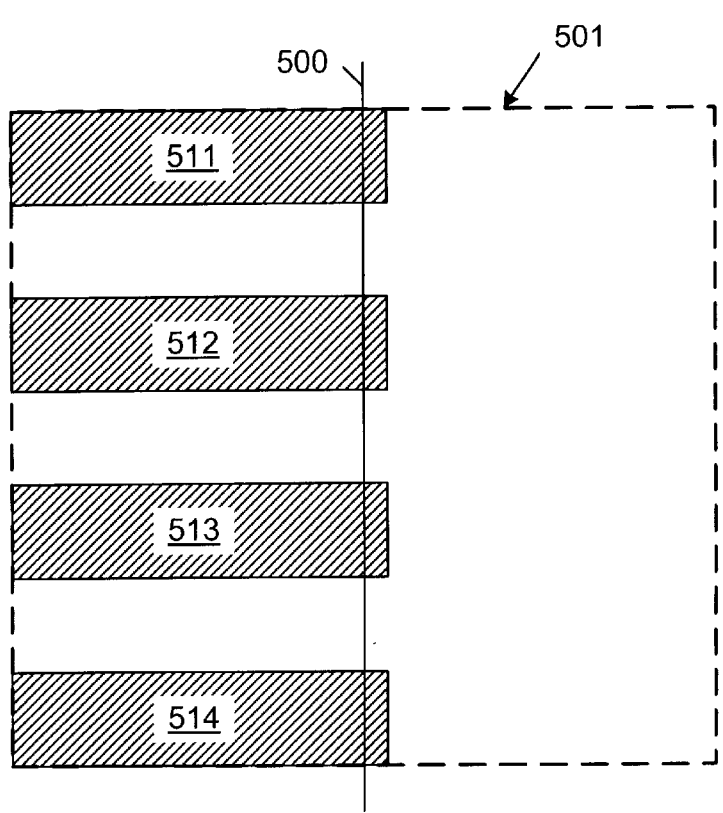
FIG. 6 is a top view of the photoresist areas exposed through the first mask sub-region of FIG. 5.

Photoresist region 501 is exposed through mask sub-region 7A of mask region 7. FIG. 6 is a top view of photoresist region 501 after exposure through mask sub-region 7A. Shaded areas 511–514 of photoresist region 501 identify the areas that are exposed to illumination through mask sub-region 7A. Note that each of these exposed areas 511–514 extends slightly over cut line 500. In the described embodiment, the exposed areas 511–514 extend over cut line 500 by about 0.05 microns. However, this value may be modified for a different process system.

Figure 7:
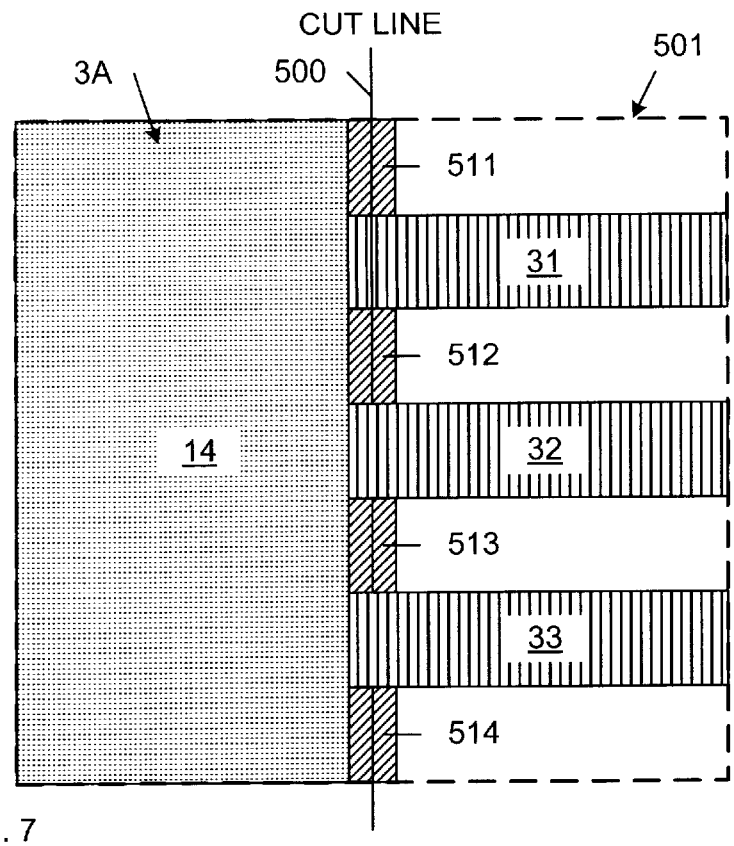
FIG. 7 is a top view of the photoresist layer of FIG. 5 exposed through a second mask sub-region.

After photoresist region 501 has been exposed through mask sub-region 7A of mask region 7, photoresist region 501 is exposed through mask sub-region 3A of mask region 3. FIG. 7 is a top view illustrating the alignment of mask sub-region 3A over photoresist region 501. In the described embodiment, cut line 500 is located on mask sub-region 3A such that cut line 500 is not precisely aligned with blinding region 14. Instead, blinding region 14 is located slightly to the left of cut line 500. As a result, the transparent portions of mask sub-region 3A have a slight overlap with respect to cut line 500. As described in more detail below, this slight overlap is controlled to control the formation of the resulting traces.

Figure 8:
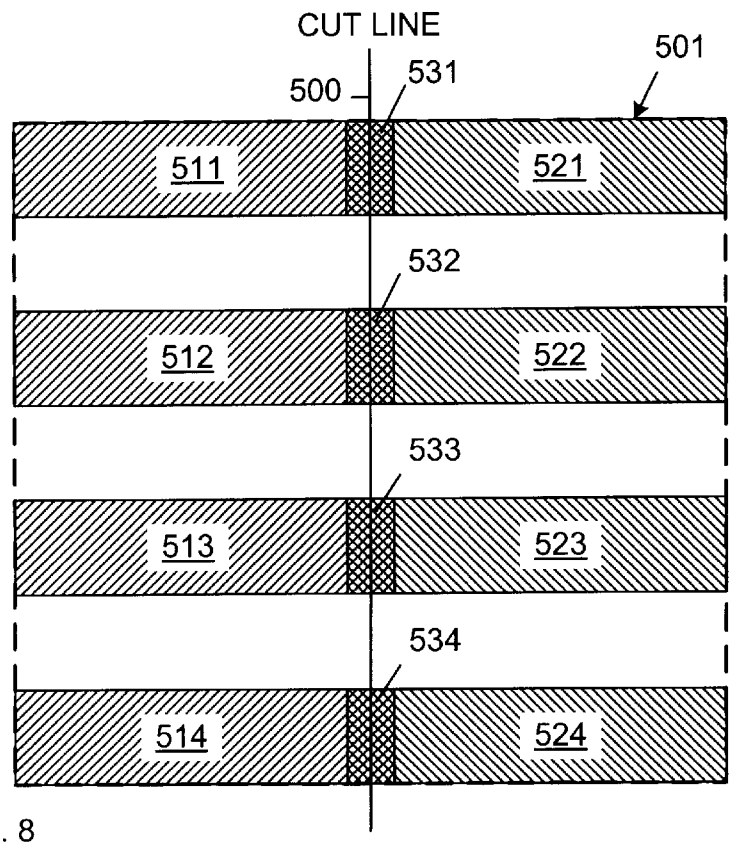
FIG. 8 is a top view of the photoresist areas exposed through the first and second mask sub-regions of FIGS. 5 and 7.

Photoresist region 501 is exposed through mask region 3. FIG. 8 is a top view of photoresist region 501 after exposure through mask sub-region 3A. Shaded areas 521–524 of photoresist region 501 identify the areas that are exposed to illumination through mask sub-region 3A. Note that each of the exposed photoresist areas 521–524 extends slightly over cut line 500. In the described embodiment, the exposed areas 521–524 extend over cut line 500 by about 0.05 microns. Again, this value may be modified for a different process system. As a result, exposed areas 511–524 overlap exposed areas 521–524 immediately adjacent to cut line 500. As a result, photoresist areas immediately adjacent to cut line 500 are double-exposed (i.e., exposed through both mask sub-regions 7A and 3A). The double exposed photoresist areas are labeled with reference numbers 531–534. Double exposed photoresist areas 531–534 have a width of about 0.10 microns.

Figure 9:
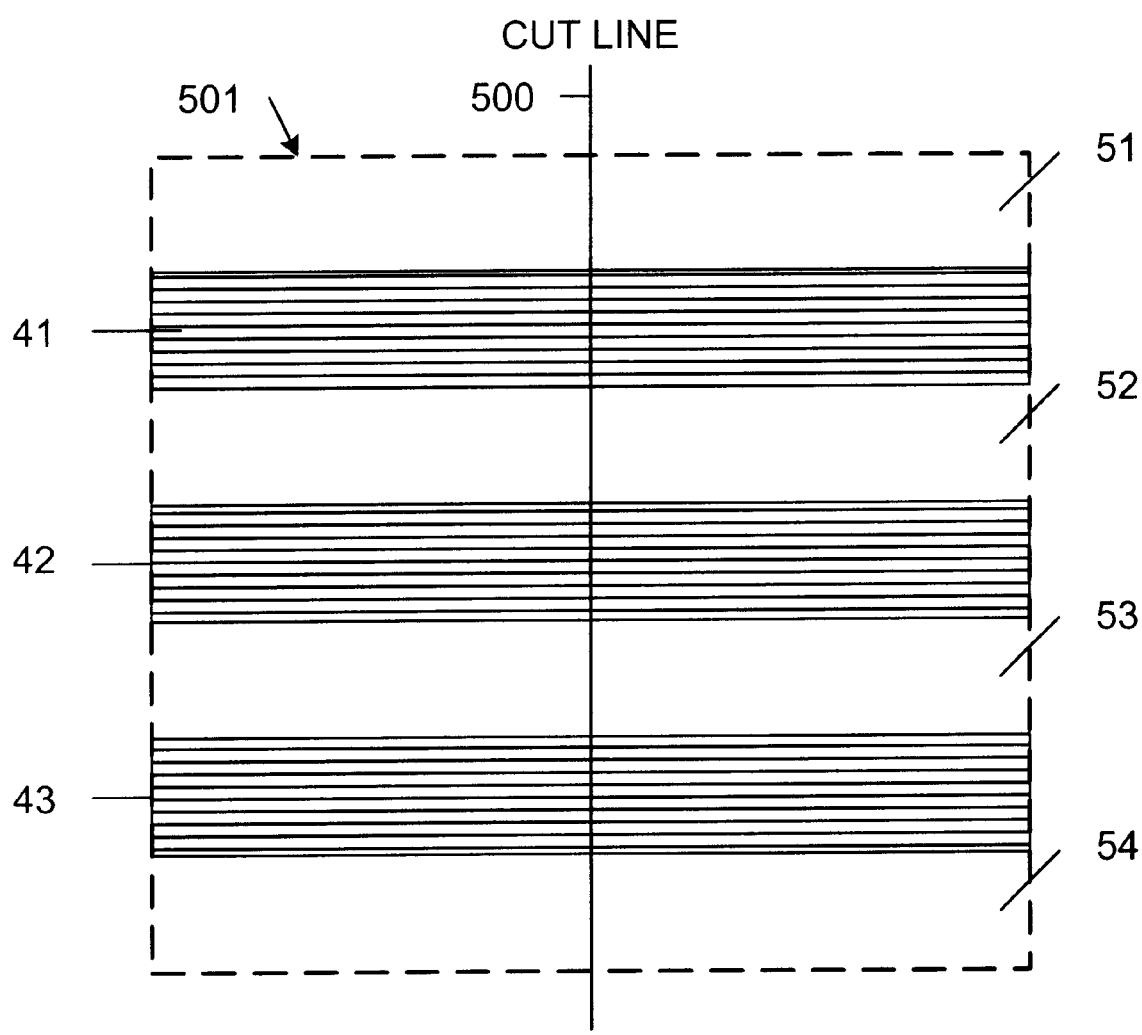
FIG. 9 is a top view of the photoresist strips that remain after the exposed photoresist areas of FIG. 8 are developed.

Photoresist layer 501 is then developed, thereby removing the exposed photoresist areas 511–514, 521–524 and 531–534. This development step exposes areas of an underlying conductive layer. FIG. 9 is a top view of photoresist region 501 illustrating the photoresist strips 41–43 which remain after the development step, as well as the exposed areas 51–54 of the underlying conductive layer. Photoresist strips 41–43 define the traces to be formed on the underlying conductive layer. An etch is performed to remove all of the conductive areas 51–54 exposed by photoresist strips 41–43. As a result, the desired conductors are formed. The shapes of the conductors are therefore defined by the shapes of the photoresist strips 41–42. Photoresist strips 41–43 are subsequently stripped.

The amount of overlap of mask regions 3 and 7 is precisely controlled to create conductors that are virtually seamless in the region immediately adjacent to cut line 500. In the described embodiment, each of mask regions 3 and 7 overlaps cut line 500 by 0.05 microns. The slight overlap is provided to ensure that the portions of the photoresist layer adjacent to cut line 500 are adequately exposed (but not over-exposed). In the described embodiment, the proper amount of overlap is determined using an iterative process. The proper amount of overlap exists when photoresist strips 41–43 have a uniform width, and do not exhibit scum, bridging or notching adjacent to cut line 500. As described in more detail below, improper amounts of overlap will result in traces that exhibit scum (positive overlap), bridging (excessive positive overlap) or notching (negative overlap).

Figure 10A:
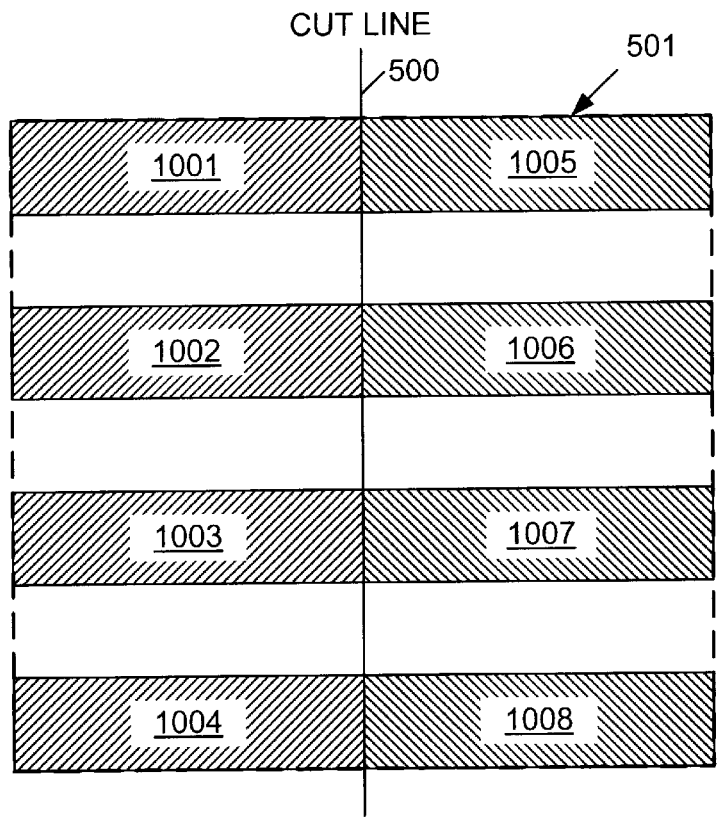
FIG. 10A is a top view of photoresist areas exposed through first and second mask sub-regions having blinding regions precisely aligned with a cut line.
Figure 10B:
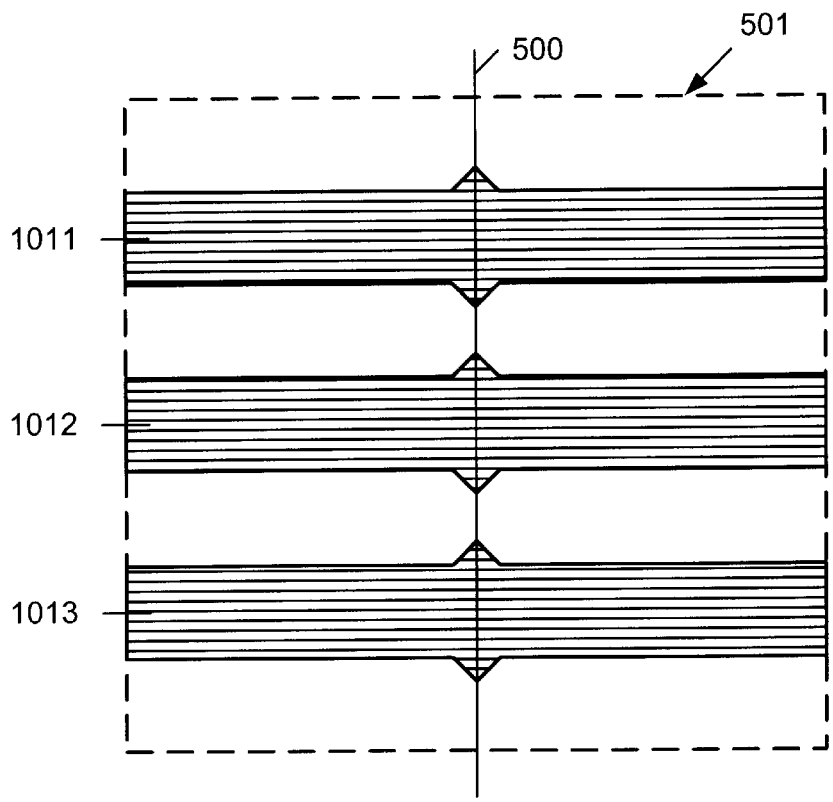
FIG. 10B is a top view of photoresist strips having scum regions which result from the exposed photoresist areas of FIG. 10A.

FIGS. 10A and 10B illustrate the formation of photoresist strips (and therefore conductive traces) exhibiting scum.

Scum refers to the undesired widening of the photoresist strips, and the resulting conductive traces, in the area adjacent to cut line 500. Scum will exist if mask regions 7 and 3 do not overlap cut line 500, or if mask regions 7 and 3 have slightly less overlap than required to form the seamless photoresist strips 41–43 illustrated in FIG. 9. FIG. 10A illustrates the exposed areas 1001–1008 of photoresist region 501 after exposure through mask regions 7 and 3, assuming that in each exposure, the blinding regions 14 are precisely aligned with cut line 500. Note that in this case there is no overlap in the exposed areas 1001–1008. This lack of overlap results in insufficient exposure of the photoresist region 501 adjacent to cut line 500. As a result, all of the photoresist in the exposed areas adjacent to cut line 500 is not removed. FIG. 10B is a top view of photoresist region 501 after the exposed areas 1001–1008 are developed. After development, photoresist strips 1011–1013 remain. Note that within photoresist strips 1011–1013, wide areas of photoresist remain at the locations adjacent to cut line 500. During a subsequent etch step, these wide areas of the photoresist result in the formation of traces having wide areas, i.e., scum, adjacent to cut line 500. This scum undesirably violates the minimum required spacing between adjacent traces. If traces having scum are observed, the process is adjusted to slightly increase the amount of overlap between mask regions 7 and 3 and cut line 500.

Figure 11A:
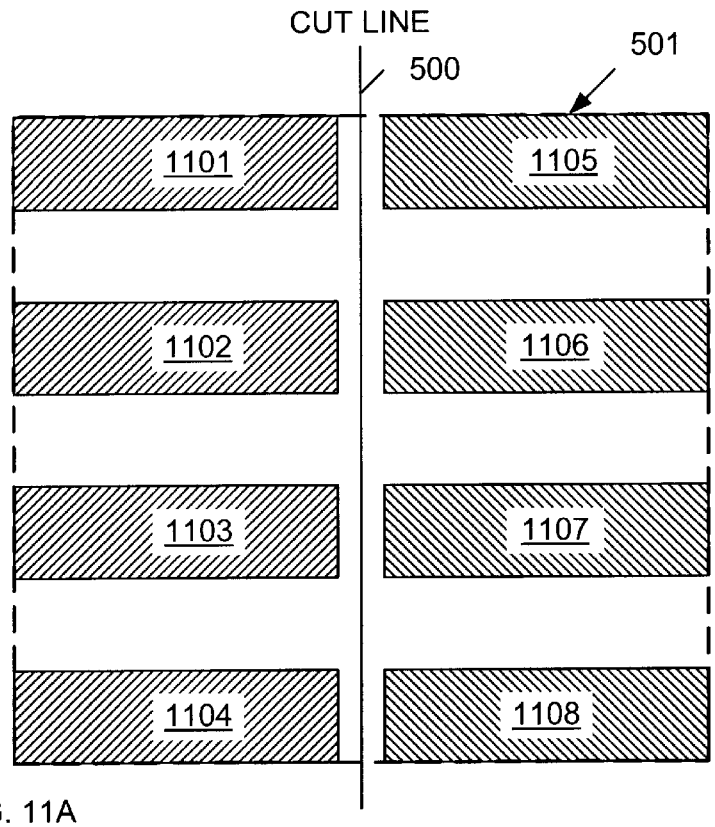
FIG. 11A is a top view of photoresist areas exposed through first and second mask sub-regions having blinding regions that cover a cut line.
Figure 11B:
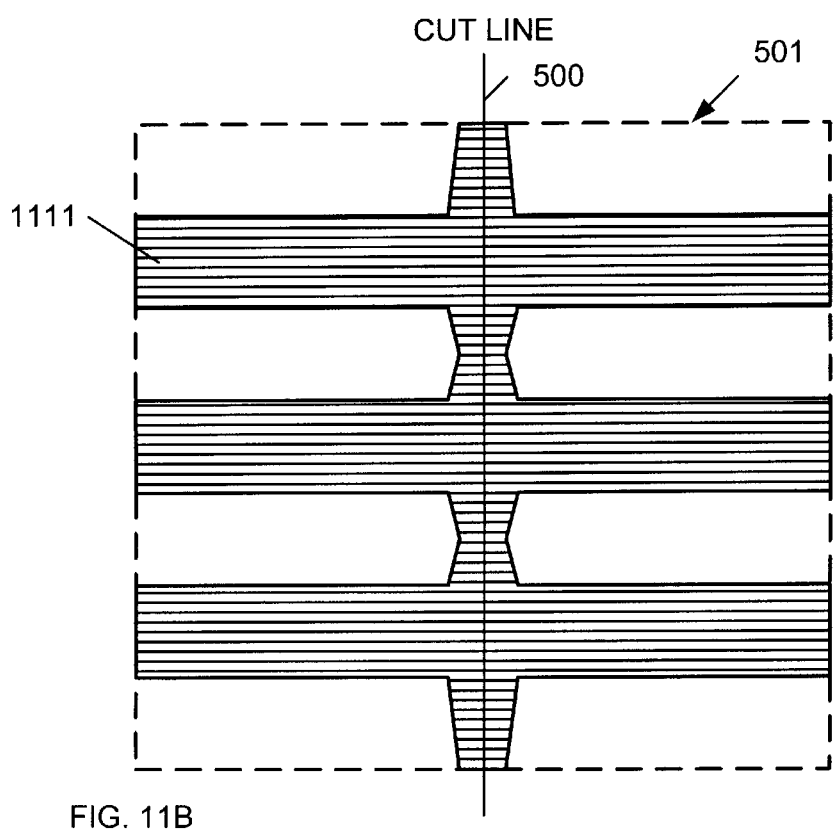
FIG. 11B is a top view of photoresist strips having bridge regions which result from the exposed photoresist areas of FIG. 11A.

FIGS. 11A and 11B illustrate the formation of photoresist strips (and therefore conductive traces) that exhibit bridging. Bridging refers to an excessive widening of the photoresist strips, and the resulting traces, in the area adjacent to cut line 500, such that adjacent traces are electrically shorted. Bridging will exist if there is a negative overlap between mask regions 7 and 3. FIG. 11A illustrates the exposed areas 1101-1108 of photoresist region 501 after exposure through mask regions 7 and 3, assuming that in each exposure, blinding region 14 covers cut line 500. Note that there are unexposed photoresist areas separating the exposed photoresist areas 1101–1108. This negative overlap results in insufficient exposure of the photoresist region 501 adjacent to cut line 500. As a result, none of the photoresist region 501 along cut line 500 is removed during the subsequent development step. FIG. 11B is a top view of photoresist region 501 after the exposed areas 1101–1108 are developed. After development, a continuous photoresist strip 1111 remains. Note that photoresist strip covers cut line 500. During a subsequent etch step, photoresist strip 1111 results in the formation of traces that are joined (i.e., shorted) by a continuous strip along cut line 500. That is, a bridging strip extends between the conductive traces. If conductive traces having bridging are observed, the process is adjusted to increase the amount of overlap between mask regions 7 and 3 and cut line 500.

Figure 12A:
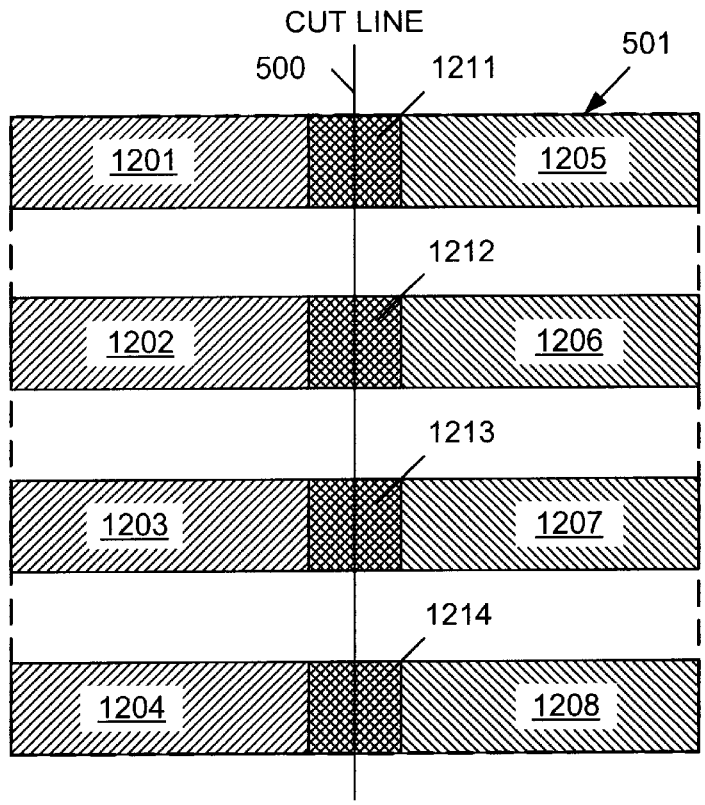
FIG. 12A is a top view of photoresist areas exposed through first and second mask sub-regions having blinding regions that are located to provide excessive exposure along a cut line.
Figure 12B:
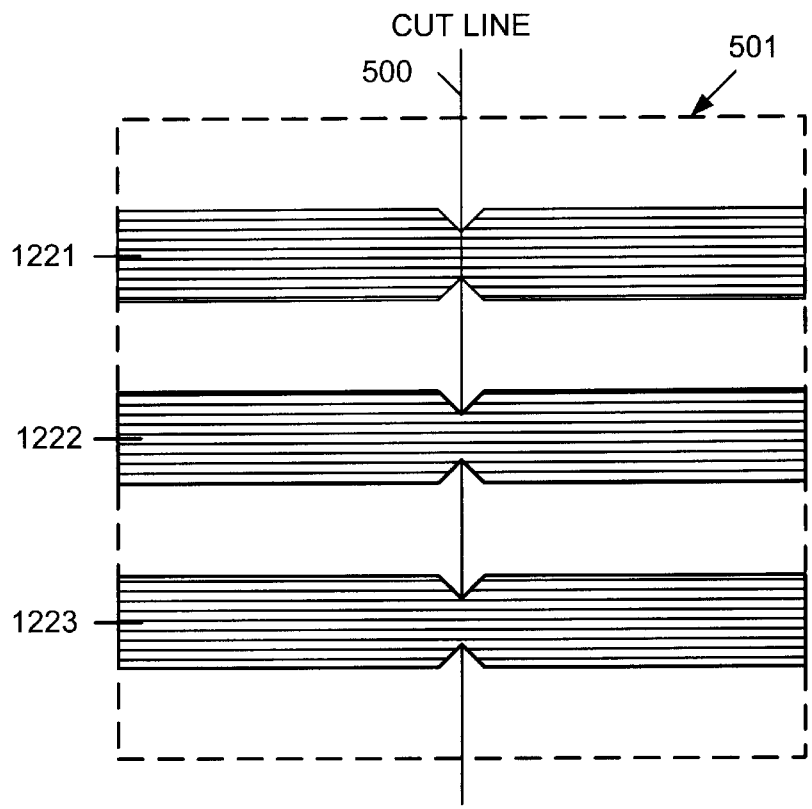
FIG. 12B is a top view of photoresist strips having notched regions which result from the exposed photoresist areas of FIG. 12A.

FIGS. 12A and 12B illustrate the formation of photoresist strips (and therefore conductive traces) that exhibiting notching. Notching refers to the undesired thinning of the photoresist strips, and the resulting conductive traces, in the area adjacent to cut line 500. Notching will exist if there is excessive overlap between mask regions 7 and 3 and cut line 500. FIG. 12A illustrates the exposed areas 1201–1208 of photoresist region 501 after exposure through mask regions 7 and 3, assuming that in the exposure of mask region 7, blinding region 14 is located to the right of the position illustrated in FIG. 5, and that in the exposure of mask region 3, blinding region 14 is located to the left of the position illustrated in FIG. 7. Note that in this case there is an excessive amount of overlap in the exposed areas 1201–1208 adjacent to cut line 500. The double exposed photoresist regions are labeled with reference numbers 1211–1214. FIG. 12B is a top view of photoresist region 501 after the exposed areas 1201–1208 are developed. After the development step, photoresist strips 1221–1223 remain. Note that within photoresist strips 1221–1223, narrow areas of photoresist remain at the locations adjacent to cut line 500. During a subsequent etch step, these narrow areas of photoresist result in the formation of conductive traces having narrow areas, i.e., notching, adjacent to cut line 500. Notching can undesirably increase the resistance of the associated conductive traces, or in extreme cases, result in discontinuous traces. If conductive traces having notching are observed, the process is adjusted to slightly reduce the amount of overlap between mask regions 7 and 3 and cut line 500.

Although the described embodiment indicates that ideal stitching conditions exist when there is a slight amount of overlap (0.1 microns) between mask regions 7 and 3 and cut line 500, the exact amount of overlap is determined by the particular characteristics of the process (e.g., the type of photoresist material used). Thus, in other embodiments, the optimal amount of overlap can be in the range of –0.3 to 0.5 microns, or in the range of –0.1 to 0.3 microns.

The results of the stitching process can be tested in several ways. In one embodiment, a critical dimension test cell is fabricated using the stitching process. The stitched lines are then examined using a microscope to determine the results of the stitching process. Appropriate adjustments in the amount of mask region overlap can then be made in accordance with the teachings set forth above.

Figure 13:
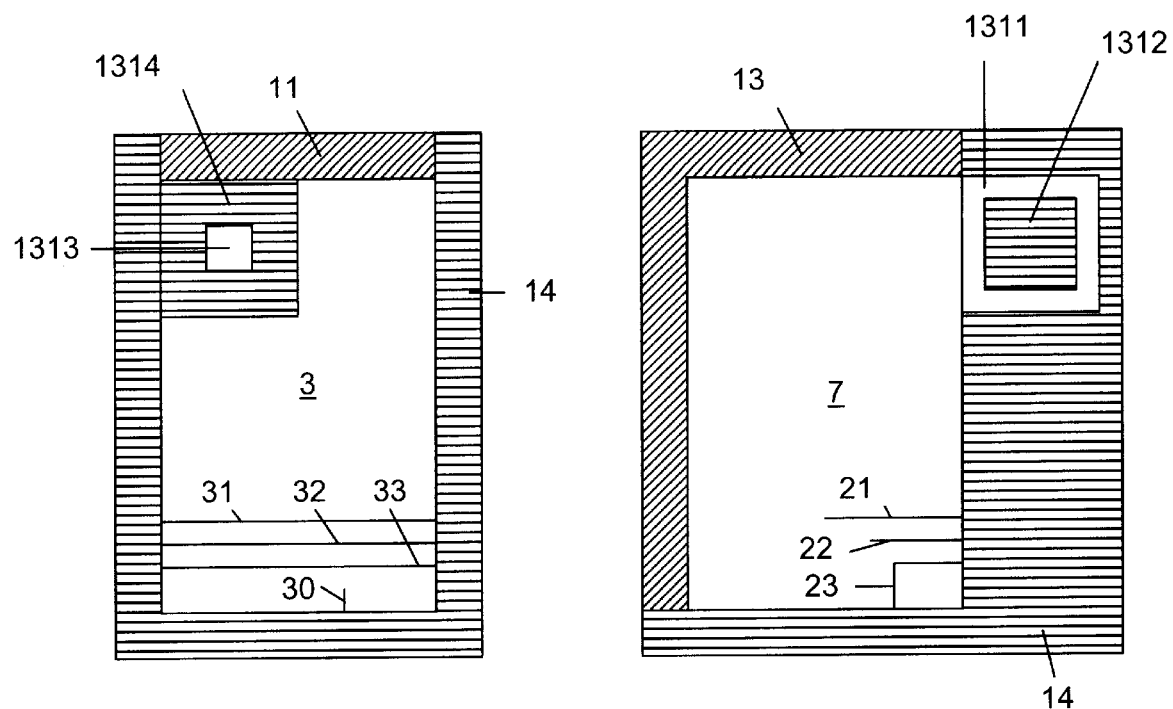
FIG. 13 is a top view of two mask regions that include complementary portions of a box-in-box pattern in accordance with one embodiment of the present invention.
Figure 14:
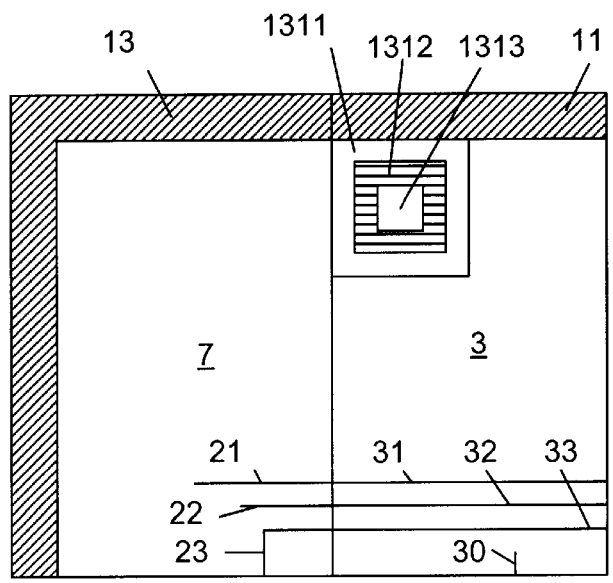
FIG. 14 is a top view of the a box-in-box pattern that results from the stitching of the two mask regions of FIG. 13.

In another embodiment, two of the mask regions to be stitched are designed to include complementary portions of a box-in-box pattern. FIG. 13 illustrates mask regions 3 and 7, which have been modified in accordance with this embodiment. Mask region 7 has been modified to include a transparent box region 1311, which surrounds an opaque box region 1312. Similarly, mask region 3 has been modified to include a transparent box region 1313, which is surrounded by an opaque box region 1314. Mask regions 7 and 3 are stitched as described above. The resulting pattern is shown in FIG. 14. Boxes 1311–1313 are dimensioned such that transparent box 1313 will be centered inside transparent box 1311 when mask region 7 is properly aligned with mask region 3.

After the underlying conductive layer has been patterned, a metrology tool is used to measure the alignment of the box-in-box pattern formed by boxes 1311–1313. In one embodiment, the metrology tool is the KLA5100 model available from KLA, Inc. This microscope is commonly used to measure the accuracy of layer to layer alignment during semiconductor processing. The accuracy of the alignment of the box-in-box pattern is representative of the alignment of the stitching process.

Figure 15:
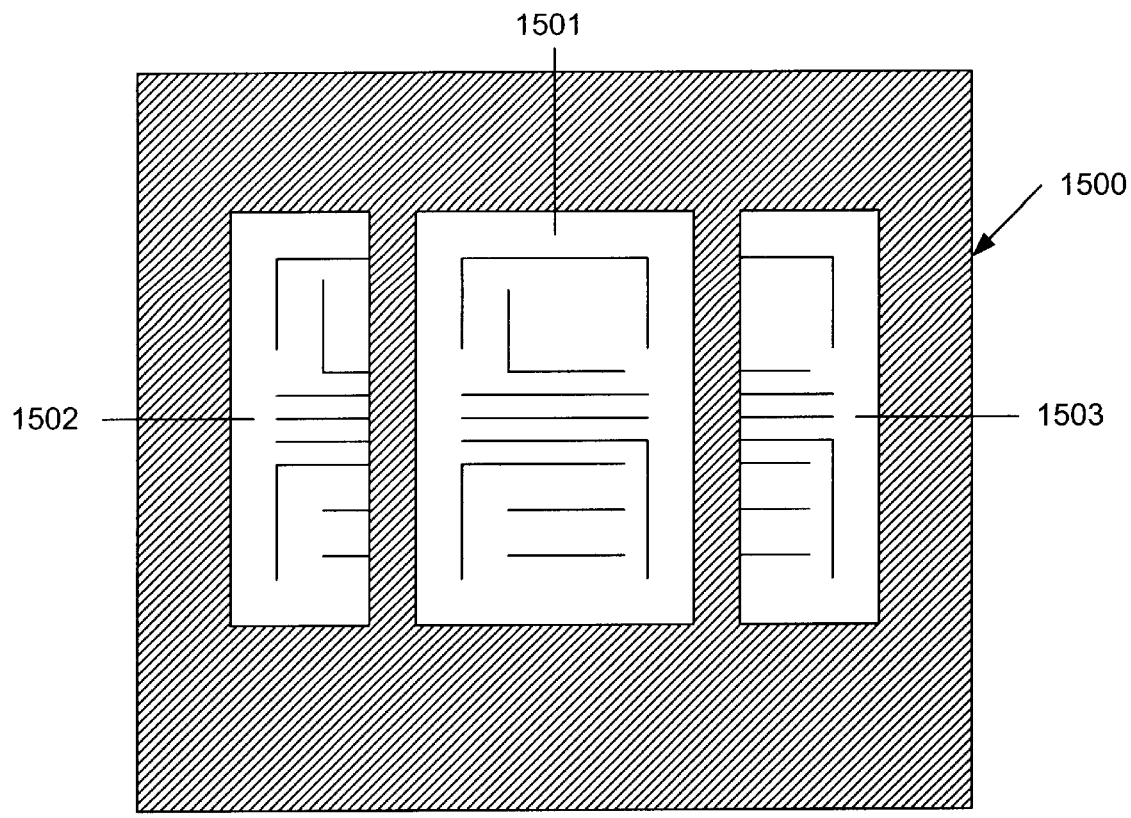
FIG. 15 is a top view of a reticle that includes both a full trace pattern and two half-trace patterns in accordance with one embodiment of the present invention.
Figure 16:
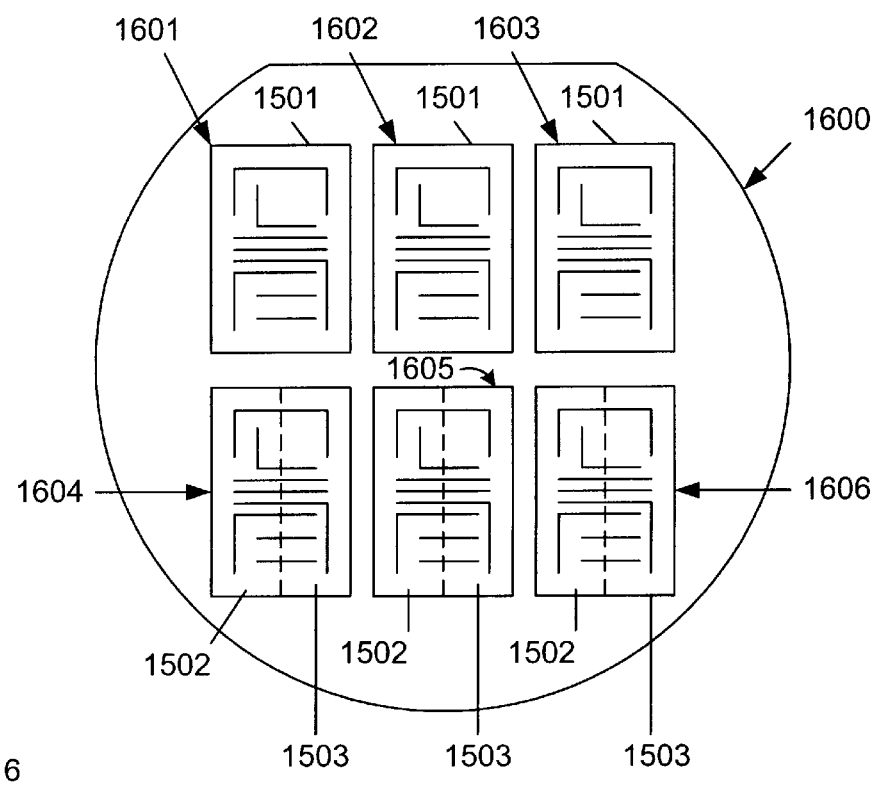
FIG. 16 is a top view of a test wafer that is fabricated using the reticle of FIG. 15.

In another embodiment, the stitching process is tested by fabricating chips having stitched and non-stitched interconnect structures on the same test wafer. FIG. 15 is a top view of a reticle 1500 in accordance with this embodiment. Reticle 1500 includes a first mask region 1501 which includes the pattern for forming an interconnect structure of a test chip. Reticle 1500 also includes a second mask region 1502 and a third mask region 1503. Second mask region 1502 includes the same pattern as the left half of mask region 1501. Third mask region 1503 includes the same pattern as the right half of mask region 1501. Thus, when mask regions 1502 and 1503 are stitched together properly, the resulting interconnect structure is the same as the interconnect structure created by the first mask region 1501. FIG. 16 is a top view of a wafer 1600 that includes six test chips 1601–1606. The interconnect structure for each of test chips 1601–1603 is formed using mask region 1501. The interconnect structure for each of test chips 1604–1606 is formed by stitching mask regions 1502 and 1503 in the manner described above. After the interconnect structures are formed, electrical tests are performed on all of the test chips 1601–1606. If the stitched test chips 1604–1606 operate in the same manner as the non-stitched test chips 1601–1603, the stitching process is classified as being successful from an electrical standpoint.

Figure 17:
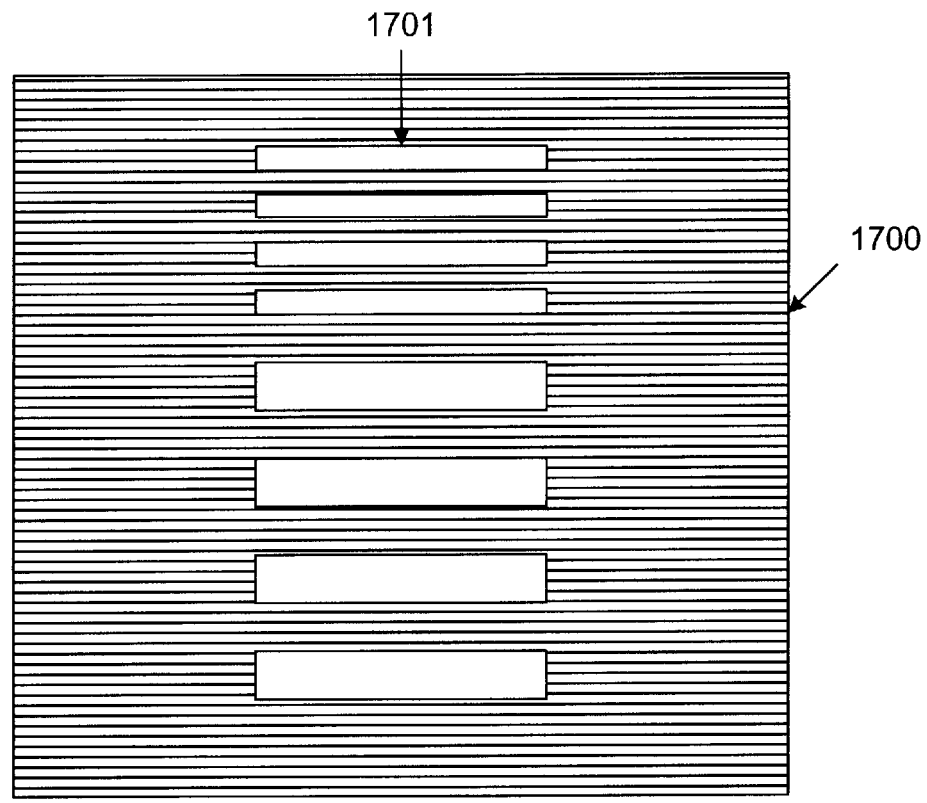
FIG. 17 is a dark field resolution mask used to test a stitching process in accordance with one embodiment of the present invention.
Figure 18:
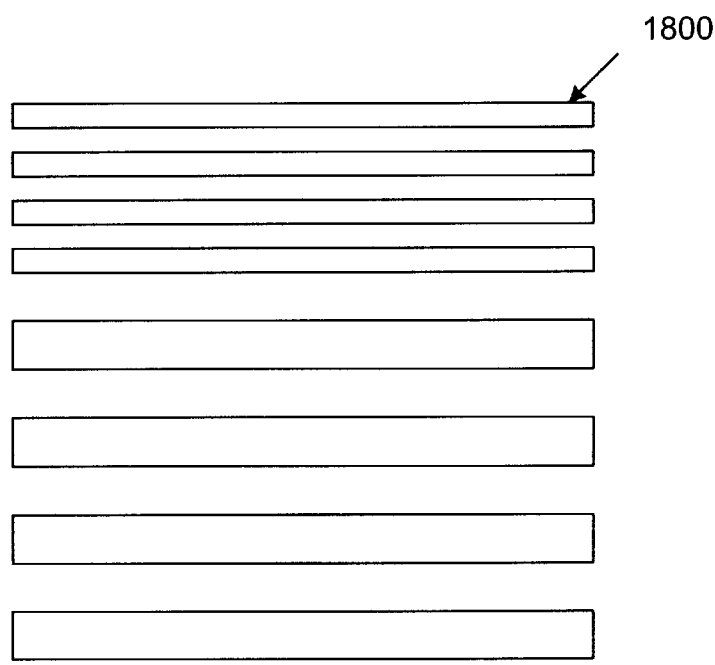
FIG. 18 is a test pattern fabricated from the dark field resolution mask of FIG. 17.

In another embodiment, the accuracy of the stitching process can be determined exposing a standard dark field resolution mask, stepping the mask to an adjacent location, exposing the mask a second time, and then checking the alignment of the resulting pattern. In the described embodiment, the resulting pattern is checked using a scanning electron microscope. FIG. 17 is a top view of a standard dark field resolution mask 1700 that can be used in accordance with one embodiment of the present invention. Mask 1700 includes a dark field pattern 1701 having a plurality of parallel lines. In this embodiment, a photoresist layer is exposed through dark field resolution mask 1700. Mask 1700 is then stepped horizontally by a distance that is about 0.10 microns less than the width of the dark field pattern 1701. The photoresist layer is then exposed again through dark field resolution mask 1700. FIG. 18 is a top view of a pattern of traces 1800 that is formed when dark field resolution mask 1700 is properly stitched.

Discussion will now return to the remaining design rules of the present invention. In another embodiment of the present invention, the stitching process is performed by defining a cut region at the edge of each mask region that is to be stitched to another mask region. A special set of design rules is then used in each cut region. In the described embodiment, the cut region is defined as follows. A cut line is defined where adjacent mask regions are to be aligned during the stitching process. The cut region of a mask region is defined as the region which extends 0.5 microns on either side of the cut line. The width of the cut region in the described embodiment is therefore 1.0 microns. The design rules for the cut region are described in more detail below.

In accordance with one cut region design rule, trace patterns that cross the cut line are widened in the cut region only. This design rule ensures that even if notching occurs due to overexposure, the width of the traces in the cut region will be sufficiently wide. This design rule is illustrated by FIGS. 19–23.

Figure 19:
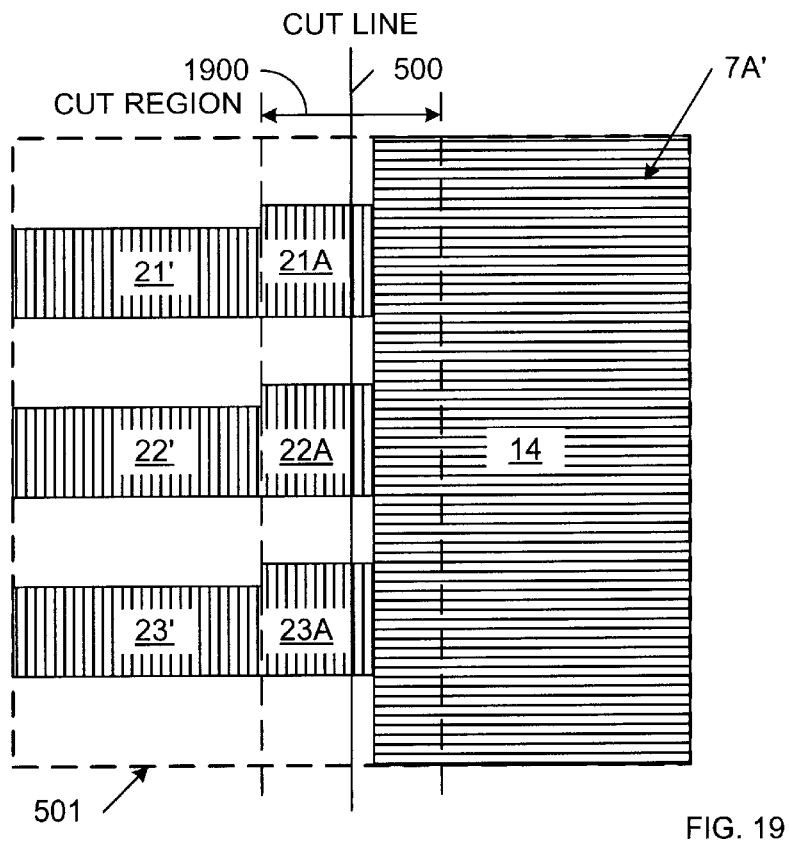
FIG. 19 is a top view of a photoresist layer that is exposed through a first mask sub-region having widened trace patterns in a cut region.

FIG. 19 shows mask sub-region 7A' having trace patterns 21'–23' which are widened only in cut region 1900, as illustrated by widened trace patterns 21A, 22A and 23A, respectively. In the described embodiment, trace patterns 21'–23' have a width of about 0.6 microns, and widened trace patterns 21A–23A have a width of about 0.7 to 0.8 microns. Photoresist layer 510 is exposed through mask sub-region 7A'.

Figure 20:
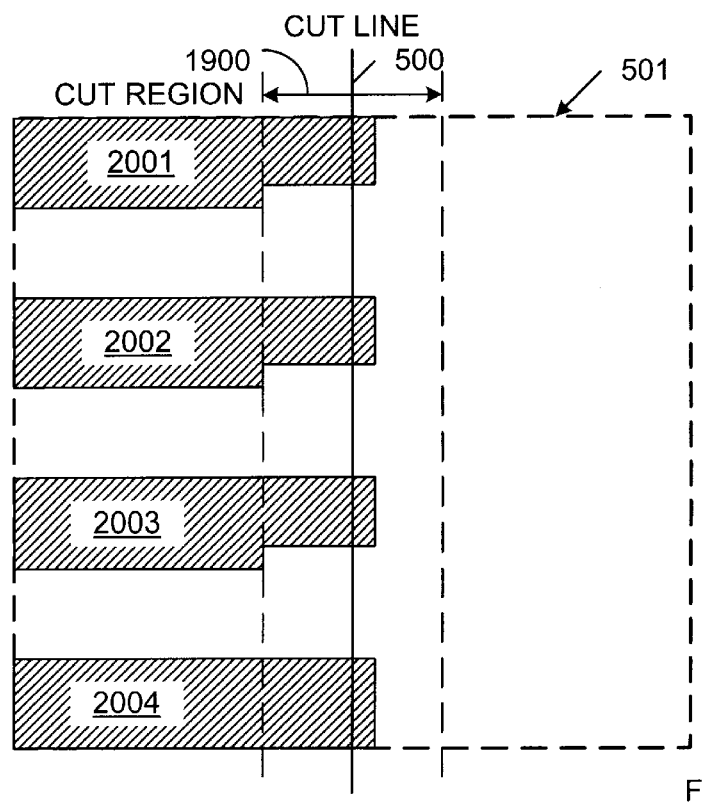
FIG. 20 is a top view of the photoresist areas exposed through the first mask sub-region of FIG. 19.

FIG. 20 is a top view of photoresist region 501 after exposure through mask sub-region 7A'. Shaded areas 2001–2004 of photoresist region 501 identify the areas that are exposed to illumination through mask sub-region 7A'. Note that each of these exposed areas 2001–2004 extends over cut line 500.

Figure 21:
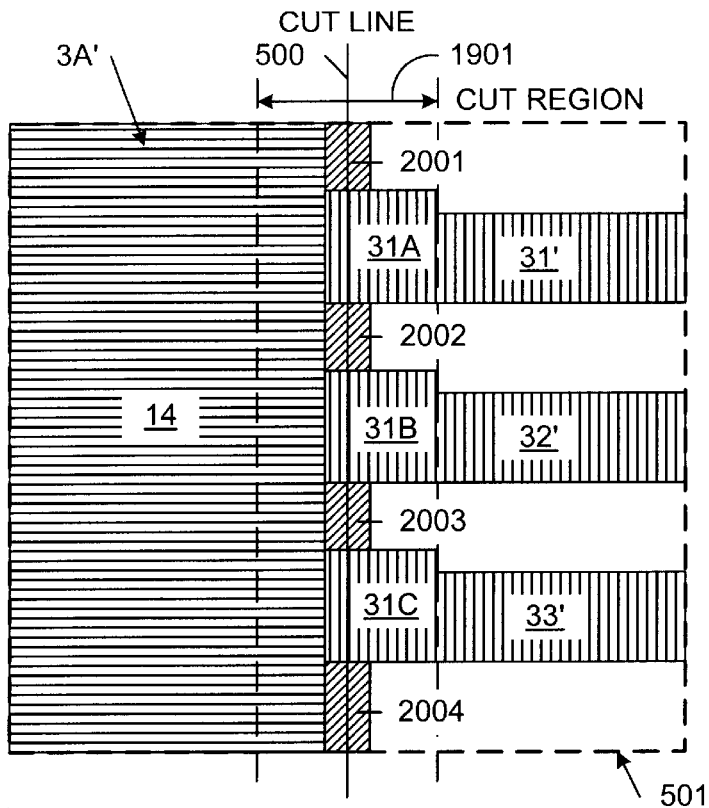
FIG. 21 is a top view of the photoresist layer of FIG. 19 exposed through a second mask sub-region having widened trace patterns in the cut region.

FIG. 21 shows mask sub-region 3A' having trace patterns 31'–33' which are widened only in cut region 1901, as illustrated by widened trace patterns 31A, 32A and 33A, respectively. In the described embodiment, trace patterns 31'–33' have a width of about 0.6 microns, and widened trace patterns 31A–33A have a width of about 0.7 to 0.8 microns. Note that the widened trace patterns 31A–31C are widened in the same manner as corresponding widened trace patterns 21A–21C. Photoresist layer 510 is exposed through mask sub-region 3A'.

Figure 22:
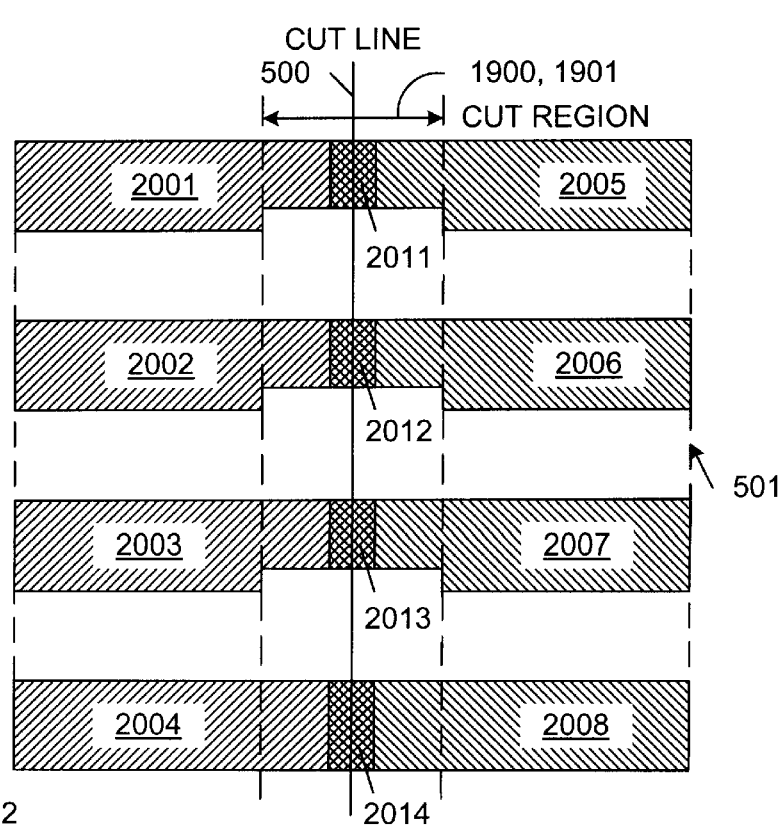
FIG. 22 is a top view of the photoresist areas exposed through the first and second mask sub-regions of FIGS. 19 and 21.

FIG. 22 illustrates photoresist areas 2005–2008, which are exposed through mask region 3 of FIG. 21. Exposed areas 2005–2008 overlap corresponding exposed areas 2001–2004 adjacent to cut line 500. The exposed regions 2001–2008 are developed.

FIG. 22 is a top view of photoresist layer 501 after exposure through mask sub-region 3A'. Shaded areas 2005–2008 of photoresist region 501 identify the areas that are exposed to illumination through mask sub-region 3A'. Note that each of the exposed photoresist areas 2005–2008 extends slightly over cut line 500. As a result, exposed areas 2001–2004 overlap exposed areas 2005–2008 immediately adjacent to cut line 500. As a result, photoresist areas immediately adjacent to cut line 500 are double-exposed (i.e., exposed through both mask sub-regions 7A' and 3A'). The double exposed photoresist areas are labeled with reference numbers 2011–2014.

Figure 23:
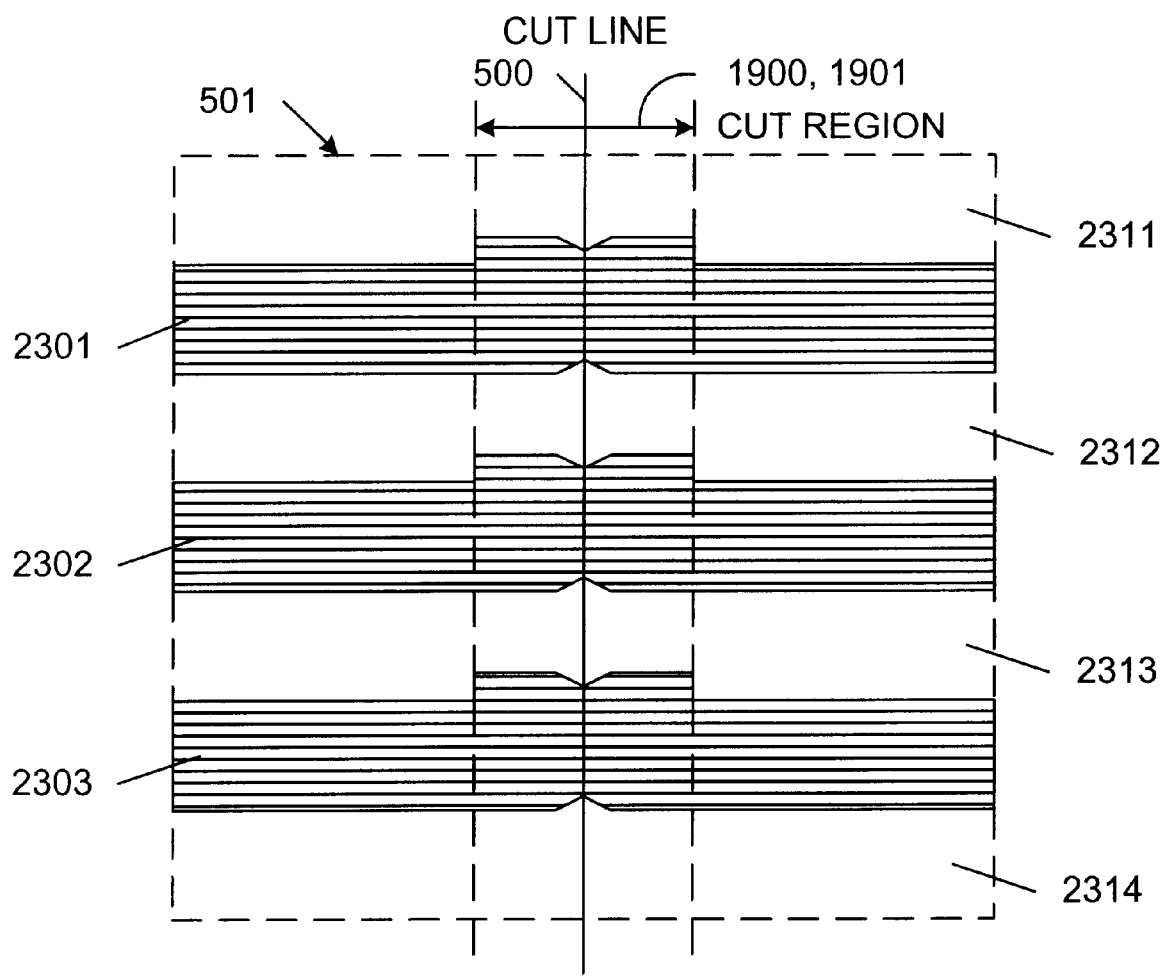
FIG. 23 is a top view of the photoresist strips that remain after the exposed photoresist areas of FIG. 22 are developed.

Photoresist layer 501 is then developed, thereby removing the exposed photoresist areas 2001–2008 and 2011–2014. This development step exposes areas of an underlying conductive layer. FIG. 23 is a top view of photoresist layer 501 illustrating the photoresist strips 2301–2303 which remain after the development step, as well as the exposed areas 2311–2314 of the underlying conductive layer. Photoresist strips 2301–2303 define the traces to be formed on the underlying conductive layer. An etch is performed to remove all of the conductive areas 2311–2314 exposed by photoresist strips 2301–2303. Note that in the described example, some notching occurs in cut region 1900–1901. However, because the trace patterns in the cut region are slightly widened, the minimum width of each conductor in the cut region is equal to or greater than the width of the conductor outside of the cut region. The minimum spacing requirements between conductors are still met.

Although the present embodiment illustrates trace patterns that are widened in only one direction (upward), it is understood that in other embodiments, the trace patterns can be widened in both directions (both upward and downward).

In accordance with another design rule, the spaces between adjacent trace patterns crossing the cut line are widened in the cut region only. This design rule ensures that even if scum occurs due to under-exposure, the conductive traces in the cut region will be sufficiently spaced apart to prevent bridging. This cut region design rule is illustrated by FIGS. 24–28.

Figure 24:
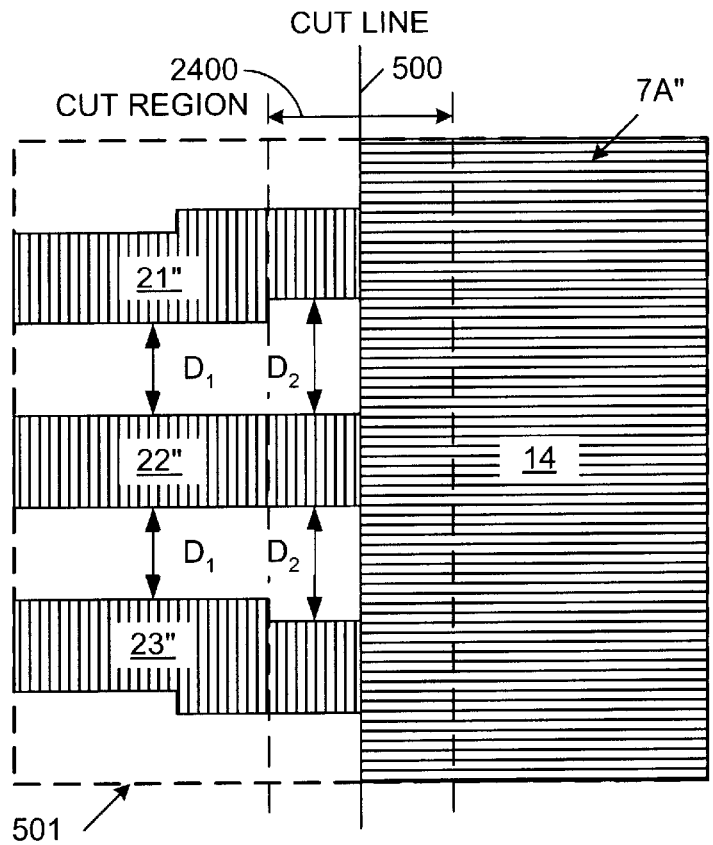
FIG. 24 is a top view of a photoresist layer that is exposed through a first mask sub-region having widened spaces between trace patterns in a cut region.

FIG. 24 shows mask sub-region 7A' having trace patterns 21"–23" which are spaced apart by wider distances inside cut region 2400, than outside of cut region 2400. In the described embodiment, trace patterns 21"–23" are separated by a distance $D_1$ of about 0.6 microns. Inside the cut region, however, trace patterns 21"–23" are separated by a distance $D_2$ of about 0.7 to 0.8 microns. Other distances can be used in other embodiments. However, distance $D_2$ is always greater than distance $D_1$. Photoresist layer 510 is exposed through the mask sub-region 7A".

Figure 25:
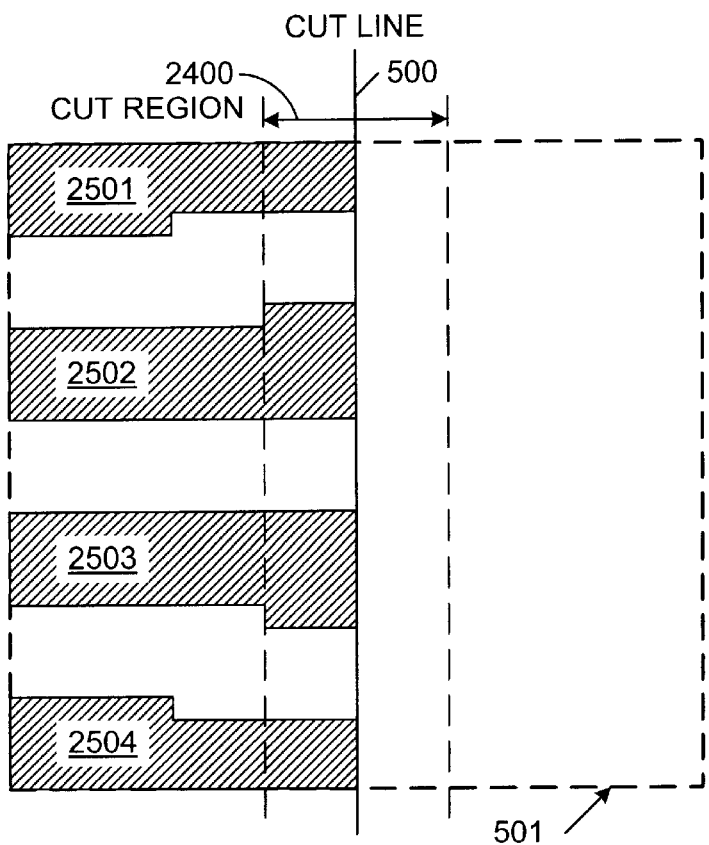
FIG. 25 is a top view of the photoresist areas exposed through the first mask sub-region of FIG. 24.

FIG. 25 is a top view of photoresist region 501 after exposure through mask sub-region 7A". Shaded areas 2501–2504 of photoresist region 501 identify the areas that are exposed to illumination through mask sub-region 7A".

Note that each of these exposed areas 2501–2504 is aligned with cut line 500.

Figure 26:
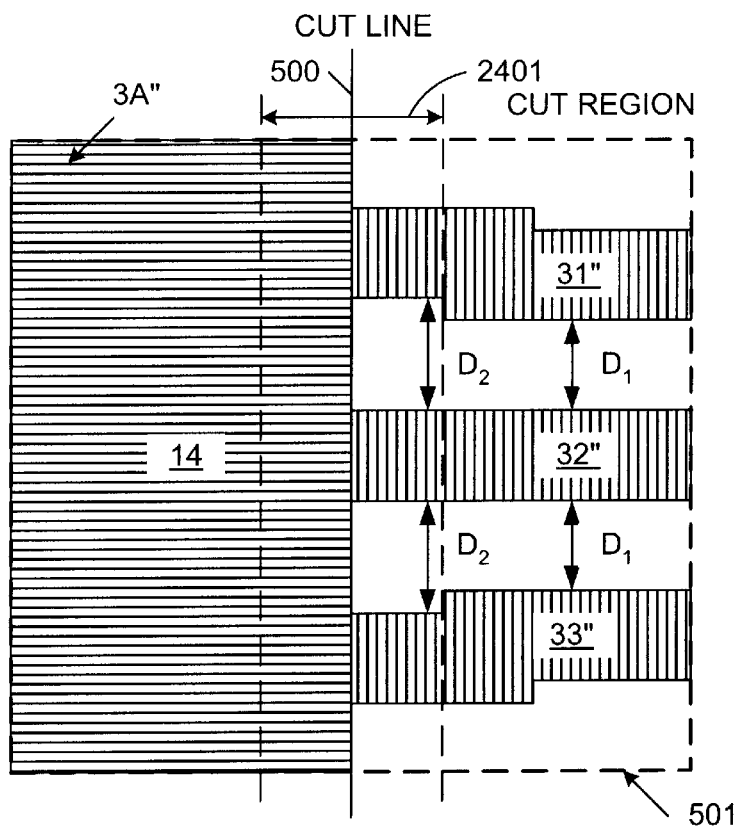
FIG. 26 is a top view of the photoresist layer of FIG. 24 exposed through a second mask sub-region having widened spaces between trace patterns in the cut region.

FIG. 26 shows mask sub-region 3A" having trace patterns 31"–33" which are spaced apart by wider distances inside cut region 2401, than outside of cut region 2401. In the described embodiment, trace patterns 31"–33" are separated by a distance $D_1$ of about 0.6 microns. Inside the cut region, however, traces 31"–33" are separated by a distance $D_2$ of about 0.7 to 0.8 microns. Other distances can be used in other embodiments. However, distance $D_2$ is always greater than distance $D_1$. Photoresist layer 510 is exposed through the mask sub-region 3A".

Figure 27:
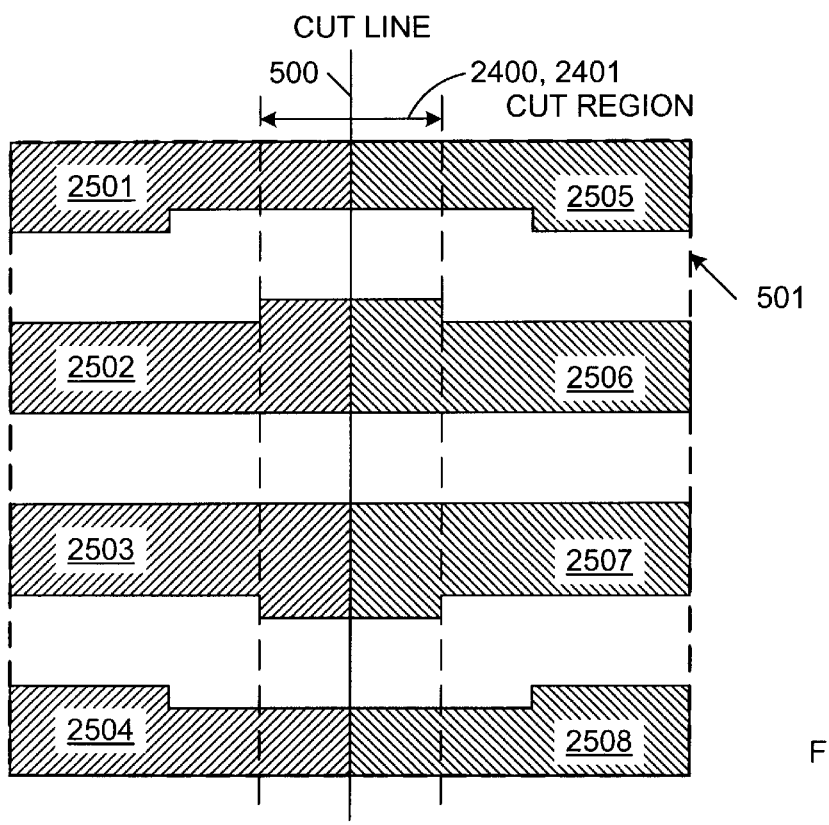
FIG. 27 is a top view of the photoresist areas exposed through the first and second mask sub-regions of FIGS. 24 and 26.

FIG. 27 is a top view of photoresist layer 501 after exposure through mask sub-region 3A". Shaded areas 2505–2508 of photoresist region 501 identify the areas that are exposed to illumination through mask sub-region 3A". Note that each of the exposed photoresist areas 2505–2508 is aligned with cut line 500. As a result, exposed areas 2501–2504 do not overlap exposed areas 2505–2508 immediately adjacent to cut line 500.

Figure 28:
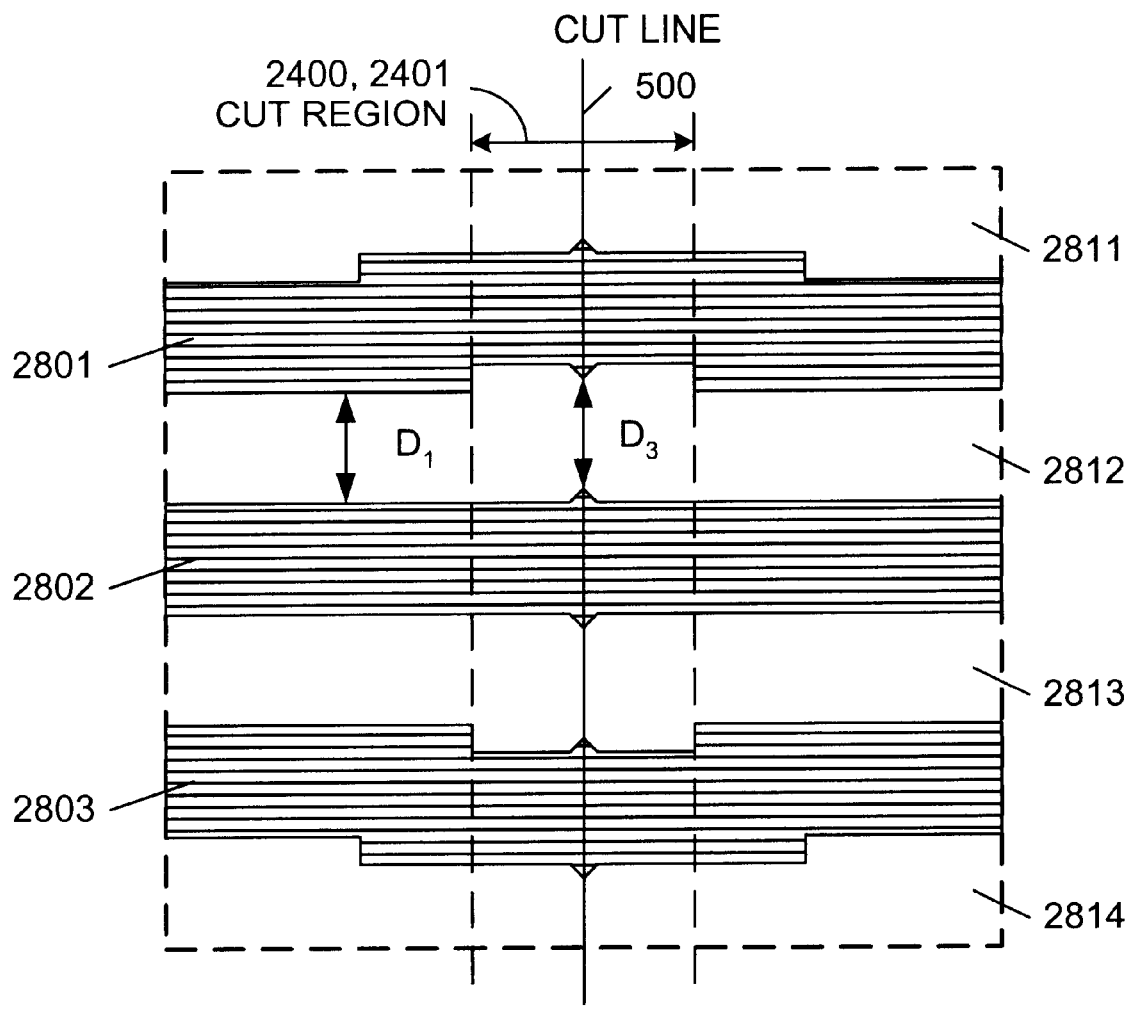
FIG. 28 is a top view of the photoresist strips that remain after the exposed photoresist areas of FIG. 27 are developed.

Photoresist layer 501 is then developed, thereby removing the exposed photoresist areas 2501–2508. This development step exposes areas of an underlying conductive layer. FIG. 28 is a top view of photoresist layer 501 illustrating the photoresist strips 2801–2803 which remain after the development step, as well as the exposed areas 2511–2514 of the underlying conductive layer. Photoresist strips 2501–2503 define the traces to be formed on the underlying conductive layer. An etch is performed to remove all of the conductive areas 2511–2514 exposed by photoresist strips 2501–2503. Note that in the described example, some scum occurs in cut region 2400–2401. However, because the spacing of the trace patterns in the cut region is slightly widened, the minimum spacing (D3) between adjacent conductors in the cut region is equal to or greater than the spacing of adjacent conductors outside of the cut region. Note that in another embodiment, the exposed areas 2501–2504 might be separated from exposed areas 2505–2508. However, in this case, the widened spacing of the trace patterns in the cut region would reduce the possibility that the resulting scum would cause bridging between adjacent traces.

In accordance with another design rule, traces can be formed in the cut region in parallel with the cut line. This design rule provides additional flexibility in the formation of traces. This design rule is illustrated by FIGS. 29–33.

Figure 29:
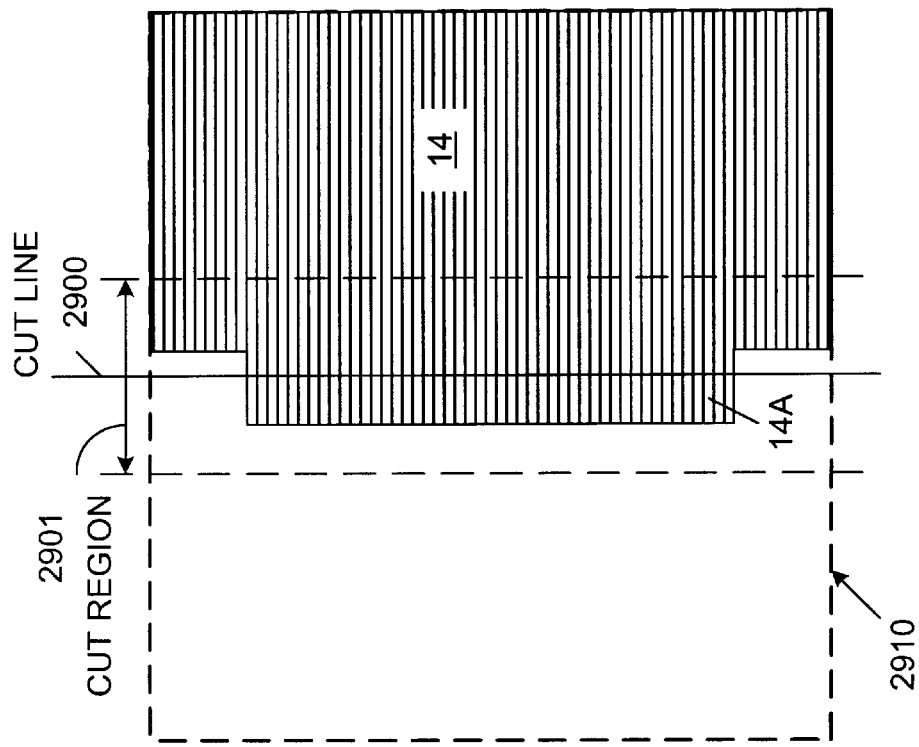
FIG. 29 is a top view of a photoresist layer that is exposed through a first mask region having an extended blinding region in a cut region.

FIG. 29 is a top view of a photoresist region 2910 that is exposed through a mask region having blinding region 14. Blinding region 14 has an extension 14A located in cut region 2901. Extension 14A extends across cut line 2900.

Figure 30:
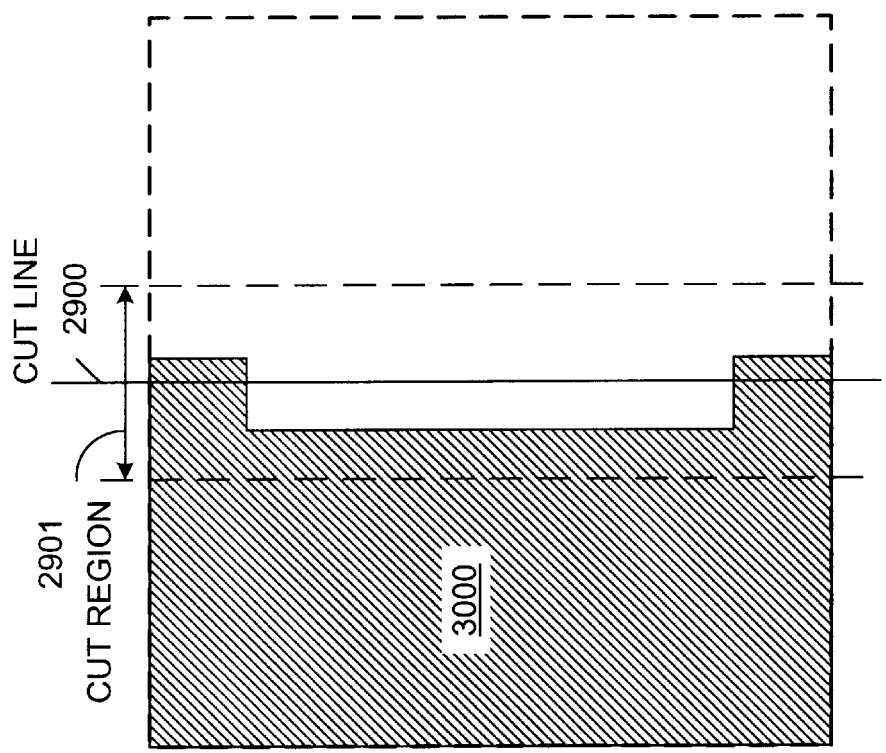
FIG. 30 is a top view of the photoresist area exposed through the first mask region of FIG. 29.

Photoresist region 2910 is exposed through the mask region of FIG. 29. FIG. 30 is a top view of photoresist region 2910 after exposure through the mask region of FIG. 29. Shaded area 3000 of photoresist region 2910 identifies exposed photoresist area.

Figure 31:
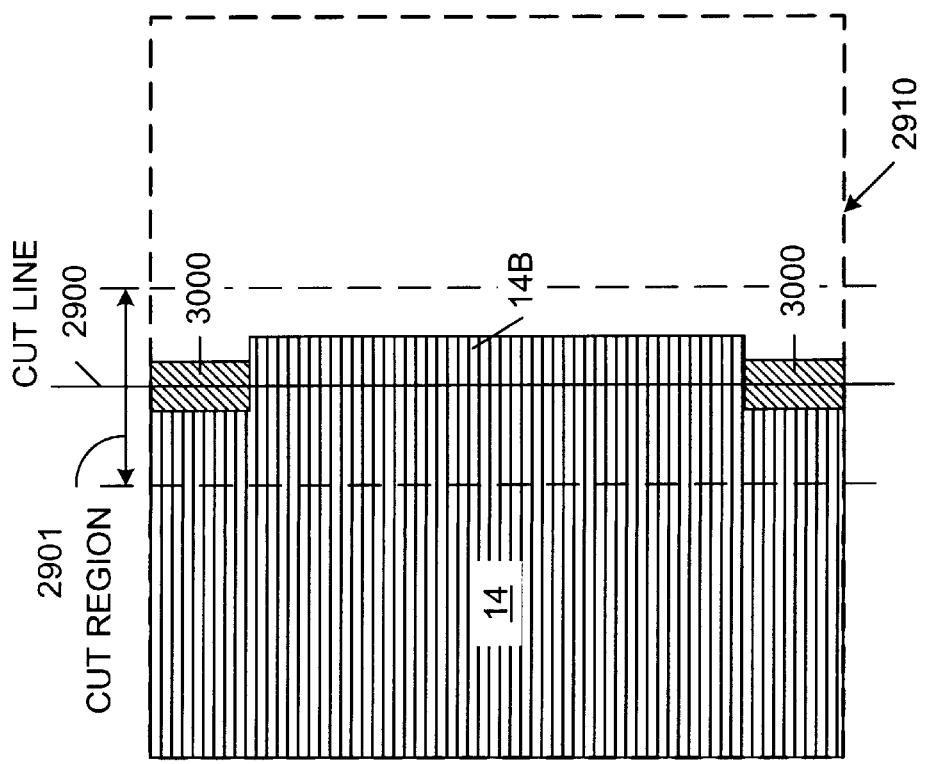
FIG. 31 is a top view of the photoresist layer of FIG. 29 exposed through a second mask region having an extended blinding region in the cut region.

After photoresist region 2910 has been exposed through the mask region of FIG. 29, a second mask region is aligned over photoresist region 2910. FIG. 31 is a top view illustrating the alignment of this second mask region over photoresist region 2910. In the described embodiment, the second mask region includes a blinding region 14. Blinding region 14 has an extension 14B located in cut region 2901. Extension 14B extends across cut line 2900. The location of extension 14B corresponds with the location of extension 14A.

Figure 32:
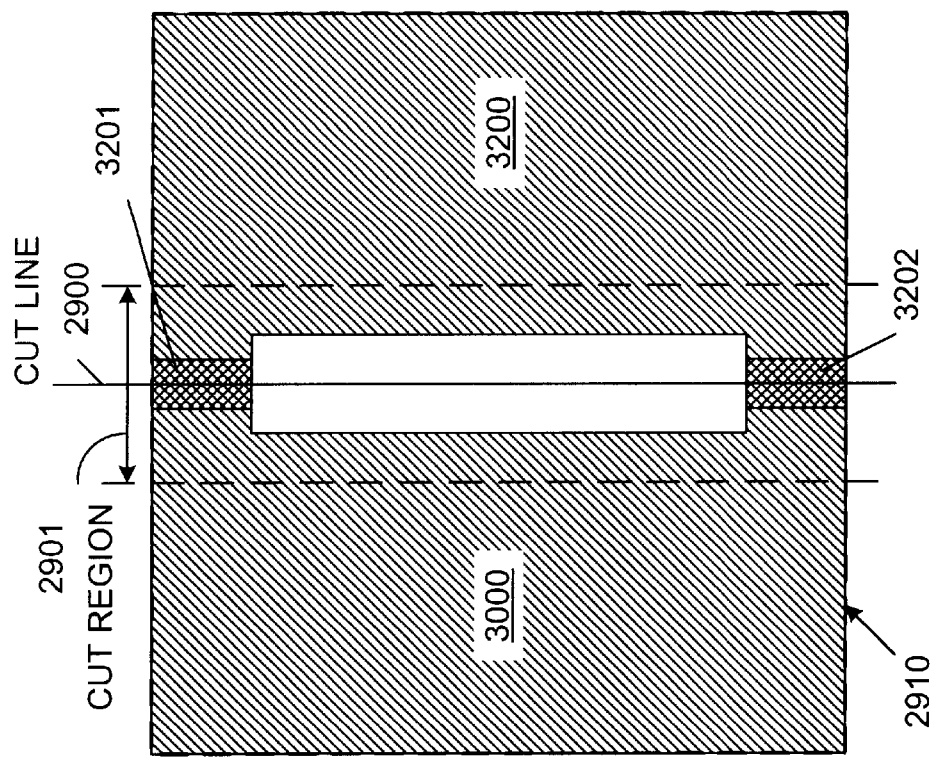
FIG. 32 is a top view of the photoresist areas exposed through the first and second mask sub-regions of FIGS. 29 and 31.

Photoresist region 2910 is exposed through the second mask region of FIG. 31. FIG. 32 is a top view of photoresist region 2910 after exposure through the second mask region. Shaded area 3200 of photoresist region 2910 identifies the area that is exposed to illumination through the second mask region. Note that each of the exposed photoresist areas 3000 and 3200 extends slightly over cut line 2900. In the described embodiment, the exposed areas 3000 and 3200 extend over cut line 2900 by about 0.10 microns. As a result, exposed area 3000 overlaps exposed area 3200 immediately adjacent to cut line 2900. These double exposed photoresist areas are labeled with reference numbers 3201 and 3202. Double exposed photoresist areas 3201-3202 have a width of about 0.20 microns.

Figure 33:
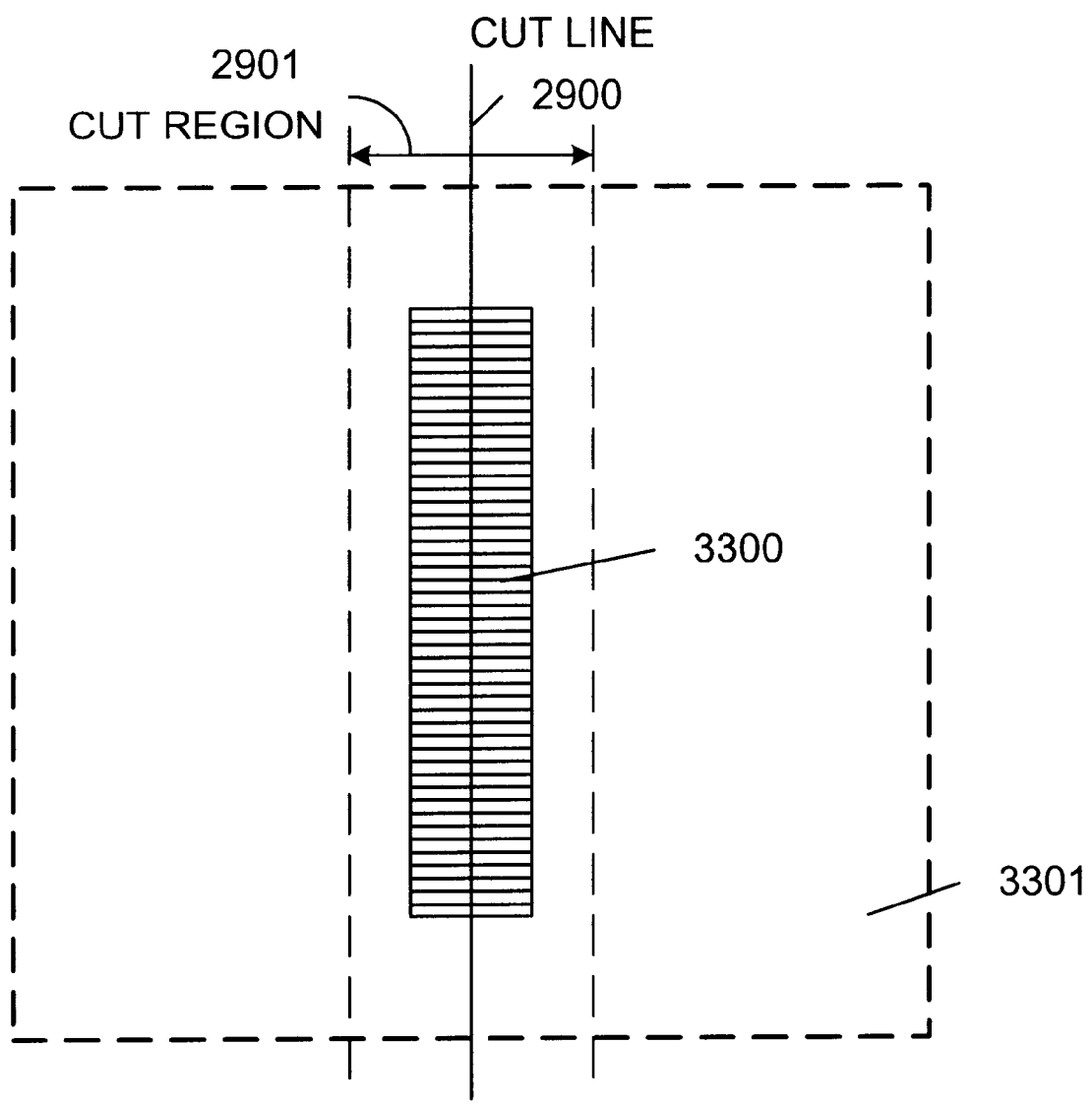
FIG. 33 is a top view of the photoresist strip that remains in the cut region after the exposed photoresist areas of FIG. 32 are developed.

Photoresist layer 2910 is then developed, thereby removing the exposed photoresist areas 3000 and 3200. This development step exposes areas of an underlying conductive layer. FIG. 33 is a top view of photoresist region 2901 illustrating the photoresist strip 3300 which remains after the development step, as well as the exposed area 3301 of the underlying conductive layer. Photoresist strip 3300 defines the trace to be formed on the underlying conductive layer. An etch is performed to remove all of the conductive material 3301 exposed by photoresist strips 3300. As a result, the desired conductor is formed in the cut region 2901. The shapes of the conductor is defined by the shape of photoresist strips 3300. Photoresist strip 3300 is subsequently stripped.

The amount of overlap of mask regions of FIGS. 29 and 31 is precisely controlled to create a conductor that has a width of about 0.5 microns. The slight overlap of these mask regions is provided to ensure that the portions of the photoresist layer 2910 adjacent to cut line 2900 are adequately exposed (but not over-exposed). In the described embodiment, the proper amount of overlap is determined using an iterative process.

The above-described embodiments teach the stitching of horizontally adjacent mask regions. However, it is understood that the same principles can be applied to accomplish the stitching of vertically adjacent mask regions.

The above-described embodiments assume that the stitching process is performed using multiple mask regions on a single reticle (e.g., reticle 200 of FIG. 2). However, the above-described principles can also be applied to enable the stitching of multiple reticles. In one embodiment of the present invention, a 40 mm×40 mm die can be fabricated by stitching four separate 20 mm×20 mm reticles.

Figure 34:
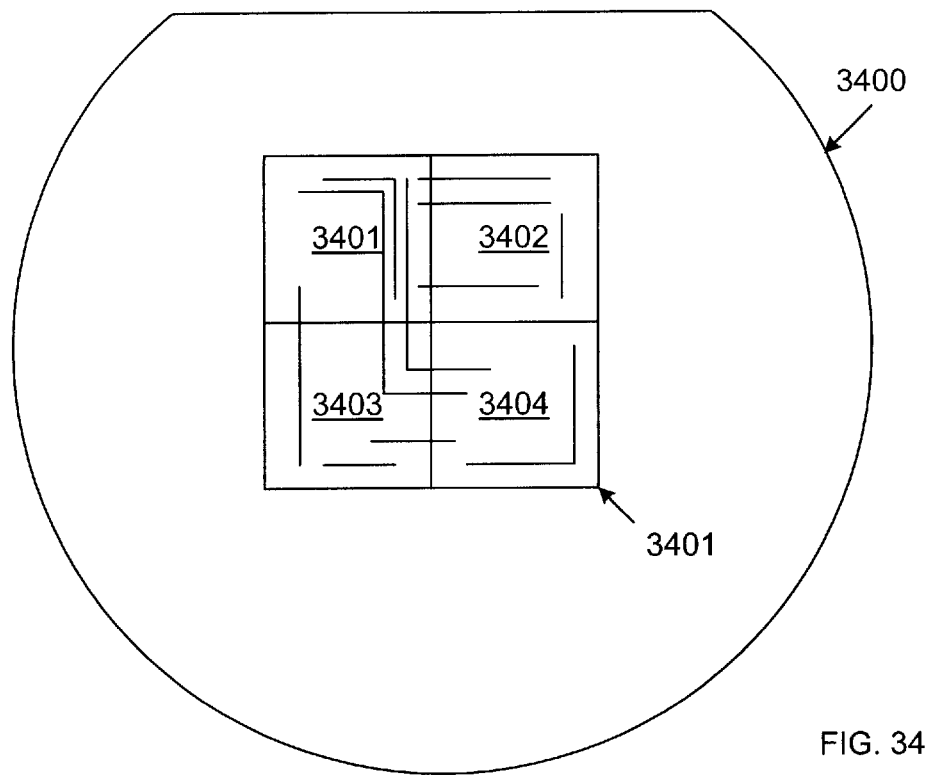
FIG. 34 is a top view of a wafer that includes an interconnect structure that is stitched from a plurality of reticles in accordance with another embodiment of the present invention.

FIG. 34 is a top view of a wafer 3400 that includes an interconnect structure 3401 that extends over an area of 40 mm by 40 mm. Interconnect structure 3401 does not include a repeatable pattern (i.e., interconnect structure 3401 cannot be reduced to smaller mask regions). Thus, interconnect structure 3401 is patterned using four separate reticles that are stitched together using the above-described design rules. The first reticle is exposed to define area 3411 of interconnect structure 3401. Second, third and fourth reticles are sequentially exposed to define areas 3412–3414 of interconnect structure 3401. Each of the patterned areas 3411–3414 has an area of 20 mm×20 mm and a minimum feature size of 0.5 microns (or less). In the embodiment illustrated in FIG. 34, all of the required connections are provided by interconnect structure 3401.

Figure 35:
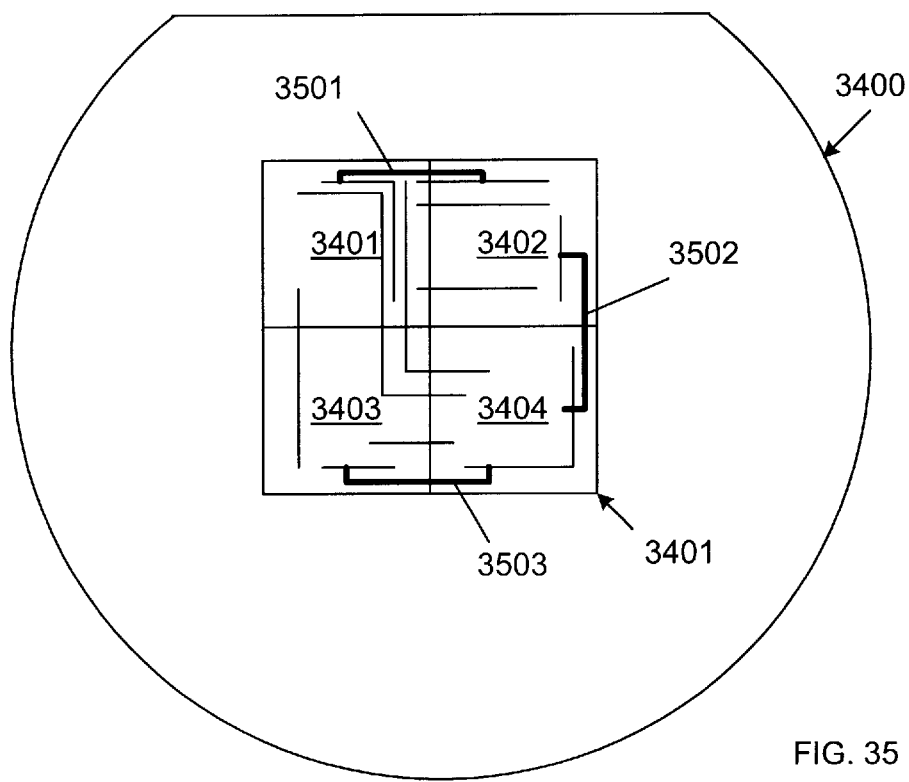
FIG. 35 is a top view of the wafer of FIG. 34, which additionally includes jumpers that are patterned from a single reticle.

FIG. 35 illustrates a variation of the embodiment of FIG. 34. In this variation, jumpers 3501–3503 are used to provide connections between various traces formed by different reticles. For example, jumper 3501 provides a connection between a trace formed by the first reticle and a trace formed by the second reticle. Jumpers 3501–3503 are formed in an interconnect layer that is located over interconnect structure 3401. Jumpers 3501–3503 are patterned through a single mask at a lower resolution. For example, jumpers 3501–3503 can be fabricated using a mask that exposes the entire wafer using a 1X mask aligner. Jumpers 3501–3503 can be fabricated in this manner because there is a relatively small number of jumpers.

The present invention advantageously enables the formation of large interconnect structures having a relatively small minimum feature size. As a result, interconnect structures for circuits having a large layout area, such as a high resolution CMOS image sensor (CIS) containing millions of pixels on a wafer, can be fabricated.

Although the present invention has been described in connection with particular embodiments, it is understood that this invention is not limited to the embodiments disclosed. Various modifications will be readily apparent to one of ordinary skill in the art. Thus, the invention is limited only by the following claims.

We claim:

1. A method for stitching a plurality of mask regions, the method comprising the steps of:

defining a cut line on a wafer; and aligning a first mask region with the cut line such that a transparent region of the first mask region has a controlled amount of overlap with respect to the cut line;

aligning a second mask region with the cut line such that a transparent region of the second mask region has a controlled amount of overlap with respect to the cut line; and selecting the controlled amount of overlap such that a photoresist pattern formed by the first and second mask regions has a uniform width adjacent to the cut line.

2. The method of claim 1, wherein the controlled amount of overlap is in the range of −0.3 to 0.5 microns.

3. The method of claim 1, wherein the controlled amount of overlap is about −0.1 to 0.3 microns.

4. The method of claim 1, wherein the controlled amount of overlap is about 0.1 microns.

5. The method of claim 1, wherein the mask regions create a pattern having a minimum feature size of 0.5 microns or less.

6. The method of claim 1, wherein the mask regions are formed on a single reticle.

7. The method of claim 1, wherein each of the mask regions is formed on a separate reticle.

8. The method of claim 7, wherein the stitching process results in the formation of an interconnect structure, the method further comprising the step of providing jumper connections between portions of the interconnect structure formed by different mask regions.

9. The method of claim 8, further comprising the step of forming the jumper connections form a single reticle.

10. The method of claim 9, wherein the interconnect structure has a smaller minimum feature size than the jumper connections.

11. The method of claim 1, further comprising the steps of:

defining cut regions on the first and second mask regions, wherein the cut regions adjoin edges of the first and second mask regions;

implementing a first set of design rules in the cut regions; and implementing a second set of design rules outside of the cut regions, wherein the first set of design rules specifies that trace patterns in the cut regions have a first width, and wherein the second set of design rules specifies that trace patterns outside of the cut regions have a second width, wherein the first width is equal to the second width.

12. The method of claim 11, wherein the first set of design rules specifies that trace patterns in the cut region have a first minimum spacing, and wherein the second set of design rules specifies that trace patterns outside of the cut region have a second minimum spacing, wherein the first minimum spacing is greater than the second minimum spacing.

13. The method of claim 11, wherein the first set of design rules specifies that trace patterns in the cut region have a first minimum spacing, and wherein the second set of design rules specifies that trace patterns outside of the cut region have a second minimum spacing, wherein the first minimum spacing is equal to the second minimum spacing.

14. A method for stitching a plurality of mask regions, the method comprising the steps of:

defining cut regions on the mask regions, wherein the cut regions adjoin edges of the mask regions to be stitched;

implementing a first set of design rules in the cut regions of the mask regions; and implementing a second set of design rules outside of the cut regions of the mask regions, wherein the first set of design rules specifies that trace patterns in the cut region have a first minimum spacing, and wherein the second set of design rules specifies that trace patterns outside of the cut region have a second minimum spacing, wherein the first minimum spacing is greater than the second minimum spacing.

15. The method of claim 14, wherein the first set of design rules specifies that trace patterns in the cut region have a first width, and wherein the second set of design rules specifies that trace patterns outside of the cut region have a second width, wherein the first width is equal to the second width.

16. A method for stitching a plurality of mask regions, the method comprising the steps of:

defining cut regions on the mask regions, wherein the cut regions adjoin edges of the mask regions to be stitched;

implementing a first set of design rules in the cut regions of the mask regions; and implementing a second set of design rules outside of the cut regions of the mask regions, wherein the first set of design rules specifies that trace patterns can be formed entirely within the cut regions.

17. A method of testing the accuracy of a stitching process, the method comprising the steps of:

aligning and exposing a first mask region having a first half of a box-in-box pattern;

aligning and exposing a second mask region having a second half of the box-in-box pattern, wherein the first half of the box-in-box pattern and the second half of the box-in-box pattern combine to form a full box-in-box pattern;

monitoring the full box-in-box pattern to determine the accuracy of the stitching process.

18. The method of claim 17, wherein the step of monitoring is performed with a metrology tool.

19. A method of testing the accuracy of a stitching process, the method comprising the steps of:

exposing a first mask region that defines a first half of an interconnect pattern;

exposing a second mask region that defines a second half of an interconnect pattern, wherein first mask region is aligned with the second mask region, and wherein the first half of the interconnect pattern and the second half of the interconnect pattern combine to define a full interconnect pattern;

exposing a third mask region that defines the full interconnect pattern; and comparing the full interconnect pattern defined by the first and second mask regions with the full interconnect pattern defined by the third mask region to determine the accuracy of the stitching process.

20. The method of claim 19, wherein the step of comparing comprises the step of comparing the electrical operation of the full interconnect pattern defined by the first and second mask region with electrical operation of the full interconnect pattern defined by the third mask region.

21. A method of testing the accuracy of a stitching process, the method comprising the steps of:

exposing a dark field resolution mask over a photoresist layer, wherein the dark field resolution mask defines a plurality of parallel lines having a first length that extend along a first axis;

stepping the dark field resolution mask along the first axis by a distance that is less than the first length along the first axis; and then exposing the dark field resolution mask over the photoresist layer;

developing the photoresist layer, thereby creating a photoresist pattern; and montitoring the photoresist pattern to determine the accuracy of the stitching process.

22. The method of claim 21, wherein the step of monitoring is performed with an optical microscope.

23. The method of claim 21, wherein the step of monitoring is performed with a scanning electron microscope.

* * * * *